(12) United States Patent
Nagao et al.

(10) Patent No.: US 7,683,860 B2
(45) Date of Patent: Mar. 23, 2010

(54) DISPLAY DEVICE, DRIVING METHOD THEREOF, AND ELEMENT SUBSTRATE

(75) Inventors: Shou Nagao, Tochigi (JP); Hajime Kimura, Kanagawa (JP); Aya Anzai, Kanagawa (JP); Yu Yamazaki, Tokyo (JP); Mitsuaki Osame, Kanagawa (JP); Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1030 days.

(21) Appl. No.: 10/999,176

(22) Filed: Nov. 30, 2004

(65) Prior Publication Data

US 2005/0116914 A1 Jun. 2, 2005

(30) Foreign Application Priority Data

Dec. 2, 2003 (JP) ............................. 2003-403837
Dec. 19, 2003 (JP) ............................. 2003-423596

(51) Int. Cl.
*G09G 3/30* (2006.01)
(52) U.S. Cl. .......................................... 345/76; 345/82
(58) Field of Classification Search ................... 345/76, 345/82, 87, 204, 98–100; 315/169.1, 169.3
See application file for complete search history.

(56) References Cited

U.S. PATENT DOCUMENTS

| 5,247,190 A | 9/1993 | Friend et al. |
| 5,399,502 A | 3/1995 | Friend et al. |
| 5,615,027 A | 3/1997 | Kuribayashi et al. |

(Continued)

FOREIGN PATENT DOCUMENTS

EP 1061497 A1 12/2000

(Continued)

OTHER PUBLICATIONS

Baldo et al., M.A.; "Highly efficient phosphorescent emission from organic electroluminescent devices"; *Letters to Nature*, vol. 395; pp. 151-154; 1998.

(Continued)

*Primary Examiner*—Amr Awad
*Assistant Examiner*—Stephen G Sherman
(74) *Attorney, Agent, or Firm*—Fish & Richardson P.C.

(57) ABSTRACT

The invention provides a display device with high image quality and high definition, a driving method thereof and an element substrate. Further, the invention provides a display device with improved degradation of a light emitting element, a driving method thereof and an element substrate. The display device of the invention has a first transistor, a second transistor, a third transistor, a light emitting element, a source driver, a first gate driver, and a second gate driver. A gate electrode of the first transistor is connected to a gate line, one of a source electrode and a drain electrode thereof is connected to a source line and the other is connected to a gate electrode of the third transistor. The light emitting element, the second transistor and the third transistor are connected in series between a first power source and a second power source. A gate electrode of the second transistor is connected to a third power source, the source driver is connected to the source line, and the first gate driver and the second gate driver are connected to the gate line.

24 Claims, 15 Drawing Sheets

U.S. PATENT DOCUMENTS

| | | | |
|---|---|---|---|
| 5,764,206 A * | 6/1998 | Koyama et al. ............... 345/80 |
| 5,814,834 A | 9/1998 | Yamazaki et al. |
| 5,990,629 A | 11/1999 | Yamada et al. |
| 6,124,840 A * | 9/2000 | Kwon ........................ 345/100 |
| 6,207,969 B1 | 3/2001 | Yamazaki |
| 6,246,384 B1 | 6/2001 | Sano |
| 6,583,775 B1 | 6/2003 | Sekiya et al. |
| 6,611,108 B2 | 8/2003 | Kimura |
| 6,661,180 B2 | 12/2003 | Koyama |
| 6,730,966 B2 | 5/2004 | Koyama |
| 6,914,390 B2 | 7/2005 | Koyama |
| 6,982,462 B2 | 1/2006 | Koyama |
| 7,057,655 B1 | 6/2006 | Masuyama |
| 7,106,006 B2 | 9/2006 | Koyama |
| 7,122,969 B2 | 10/2006 | Fukumoto et al. |
| 7,129,918 B2 | 10/2006 | Kimura |
| 7,141,934 B2 | 11/2006 | Osame et al. |
| 7,173,586 B2 | 2/2007 | Osame et al. |
| 7,187,350 B2 | 3/2007 | Yoshida |
| 7,209,101 B2 | 4/2007 | Abe |
| 7,315,295 B2 | 1/2008 | Kimura |
| 2001/0002703 A1 | 6/2001 | Koyama |
| 2001/0017618 A1 | 8/2001 | Azami |
| 2001/0022565 A1 | 9/2001 | Kimura |
| 2001/0035849 A1 | 11/2001 | Kimura et al. |
| 2002/0113760 A1 | 8/2002 | Kimura |
| 2002/0135312 A1 | 9/2002 | Koyama |
| 2002/0196389 A1 | 12/2002 | Koyama |
| 2003/0020969 A1 | 1/2003 | Kimura |
| 2003/0067424 A1 | 4/2003 | Akimoto et al. |
| 2003/0090447 A1 | 5/2003 | Kimura |
| 2003/0164685 A1 | 9/2003 | Inukai |
| 2003/0222589 A1 | 12/2003 | Osame et al. |
| 2004/0041750 A1 | 3/2004 | Abe |
| 2004/0251953 A1 | 12/2004 | Yamazaki et al. |
| 2004/0252565 A1 | 12/2004 | Yamazaki et al. |
| 2005/0012686 A1 | 1/2005 | Osame et al. |
| 2006/0033161 A1 | 2/2006 | Koyama |
| 2007/0007527 A1 | 1/2007 | Koyama |
| 2007/0115223 A1 | 5/2007 | Kimura |
| 2007/0139315 A1 | 6/2007 | Abe |

FOREIGN PATENT DOCUMENTS

| | | |
|---|---|---|
| EP | 1 107 220 A2 | 6/2001 |
| EP | 1288902 A1 | 3/2003 |
| JP | 09-162414 | 6/1997 |
| JP | 09-270518 | 10/1997 |
| JP | 10-092576 | 4/1998 |
| JP | 10-239665 | 9/1998 |
| JP | 11-176521 | 7/1999 |
| JP | 2001-324958 | 11/2001 |
| JP | 2002-149112 | 5/2002 |
| JP | 2002-278497 | 9/2002 |
| JP | 2002-323873 | 11/2002 |
| JP | 2002-351357 | 12/2002 |
| JP | 2002-358031 | 12/2002 |
| JP | 2003-058107 | 2/2003 |
| WO | WO 90/13148 A1 | 11/1990 |
| WO | WO 03/27997 A1 | 4/2003 |

OTHER PUBLICATIONS

Baldo et al., M.A.; "Very high-efficiency green organic light-emitting devices based on electrophosphorescence"; *Applied Physics Letters*, vol. 75, No. 1; pp. 4-6; 1999.

Han et al., Chang Wook; "Green OLED with low temperature poly Si TFT"; *EuroDisplay '99*; pp. 27-30; 1999.

Inukai et al., Kazutaka; "4.0-in. TFT-OLED Displays and a Novel Digital Driving Method"; *SID '00 Digest*, pp. 924-927; 2000.

Kimura et al., Mutsumi; "TFT-LEPD with Image Uniformity by Area Ratio Gray Scale"; *EuroDisplay '99*; pp. 71-74; 1999.

Kimura et al.; "Low Temperature Poly-Si TFT Driven Light-Emitting-Polymer Display and Digital Gray Scale for Uniformity"; *IDW 99*; pp. 171-174; 1999.

Mizukami et al., Mayumi; "6-Bit Digital VGA OLED"; *SID 00 Digest*; pp. 912-915; 2000.

Schenk et al., Hermann; "Polymers for Light Emitting Diodes"; *EuroDisplay '99*; pp. 33-37; 1999.

Shimoda et al., Tatsuya; "High Resolution Light Emitting Polymer Display Driven by Low Temperature Polysilicon Thin Film Transistor with Integrated Driver"; *Asia Display 98*; pp. 217-220; 1998.

Shimoda et al.; "Current Status and Future of Light-Emitting Polymer Display Driven by Poly-Si TFT"; *SID 99 Digest*; pp. 372-375; 1999.

Shimoda et al.; "Technology for Active Matrix Light Emitting Polymer Displays"; *IEDM 99*; pp. 107-110; 1999.

Tsutsui et al., Tetsuo; "Electroluminescence in Organic Thin Films"; *Photochemical Processes in Organized Molecular Systems*; pp. 437-450; 1991.

Tsutsui et al., Tetsuo; "High Quantum Efficiency in Organic Light-Emitting Devices with Iridium-Complex as a Triplet Emissive Center"; *Japan Journal of Applied Physics*, vol. 38, Part 2, No. 12B; pp. L1502-L1504; 1999.

Written Opinion and International Search Report (Application No. PCT/JP2004/003546) with partial translation, May 11, 2004.

Chinese Office Action (Application No. 200410098059.5), dated Nov. 16, 2007 with full English translation, 27 pages.

Yadid-Pecht.O et al., "Wide Dynamic Range APS Star Tracker,", Solid State Sensor Arrays and CCD Cameras (Proceedings, SPIE—The International Society for Optical Engineering), 1996, vol. 2654, pp. 82-92.

Yang.D et al., "A 640×512 CMOS Image Sensor with Ultra Wide Dynamic Range Floating-Point Pixel-Level ADC,", ISSCC 99 (Digest of Technical Papers, IEEE International Solid-State Circuits Conference), 1999, pp. 308-309.

* cited by examiner

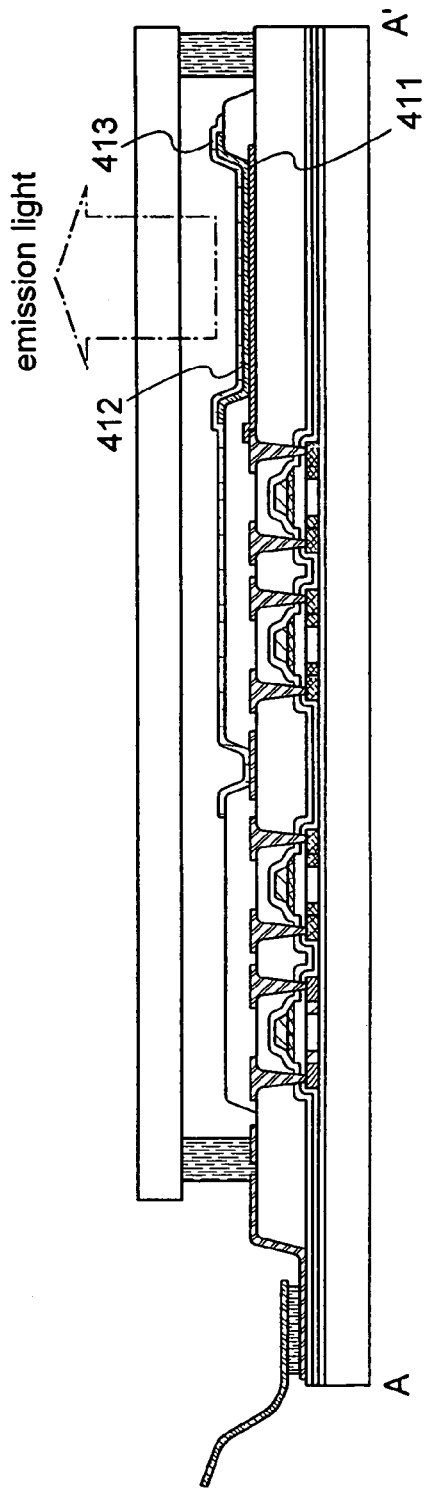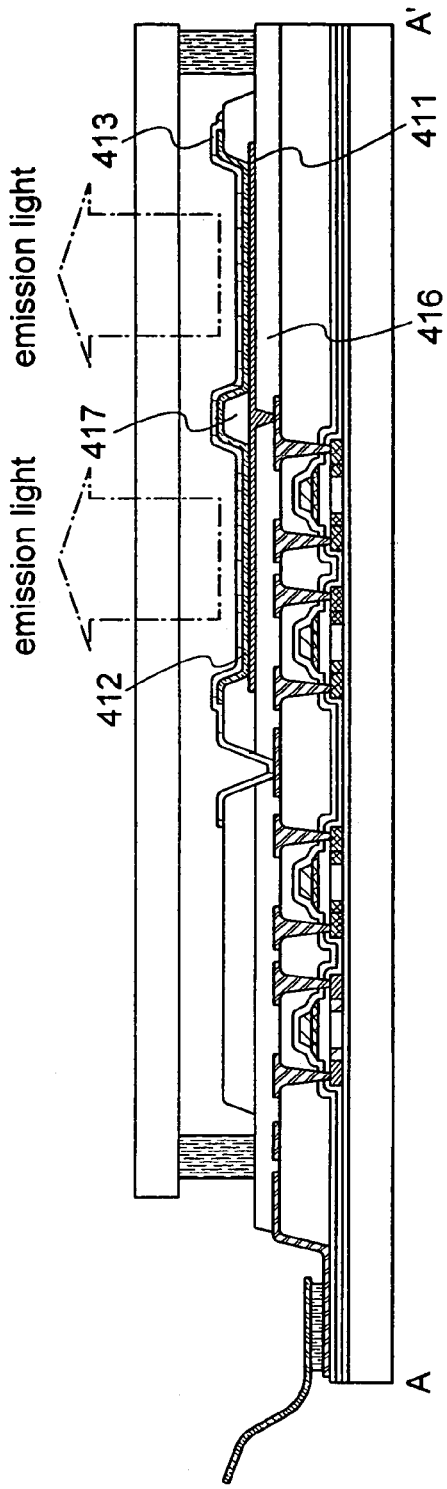

DISPLAY DEVICE, DRIVING METHOD THEREOF, AND ELEMENT SUBSTRATE

BACKGROUND OF THE INVENTION

1. Field of the Invention

The present invention relates to a display device having a self-luminous element, a driving method thereof, and an element substrate having an element over an insulating surface.

2. Description of the Related Art

In recent years, a display device having a self-luminous element typified by an electroluminescence element has been studied and developed, and it is expected to be widely used taking advantage of the features of self-luminous type such as high image quality, wide viewing angle, and thinness and light weight without requiring a backlight. One of the features of the display device having a light emitting element is that signals are written to pixels in a plurality of different stages during one gate signal line selection period (see Patent Document 1, for example).

[Patent Document 1] Japanese Patent Laid-Open No. 2001-324958

In a pixel circuit disclosed in Patent Document 1, a gate-source voltage of a driving TFT for controlling a current value flowing to a light emitting element is varied due to capacitive coupling and the like when potentials of a source line, a gate line and the like that are adjacent to each other are varied. As a result, a current value flowing in the driving TFT is changed, leading to inverted gray scale of images of scenes and the like with gradations.

SUMMARY OF THE INVENTION

In view of the foregoing, the invention provides a display device with high image quality and high definition, a driving method thereof, and an element substrate. Further, the invention provides a display device with improved degradation of a light emitting element, a driving method thereof, and an element substrate.

In order to solve the aforementioned conventional problems, the invention provides a display device, an element substrate, and a driving method of the display device having the following structures.

A display device of the invention comprises a first transistor having one of a source electrode and a drain electrode of which is connected to a source line and a gate electrode of which is connected to a gate line, a light emitting element, a second transistor and a third transistor that are connected in series between a first power source and a second power source, a source driver connected to the source line, and a first gate driver and a second gate driver that are connected to the gate line. A gate electrode of the second transistor is connected to a third power source, and a gate electrode of the third transistor is connected to the other of the source electrode and the drain electrode of the first transistor.

A display device of the invention comprises a source driver having a shift register, a latch and a switch. The switch is connected to a selection signal line for transmitting a write/erase selection signal (hereinafter referred to as a WE signal and denoted by WE in the drawings). More specifically, the switch comprises an erasing transistor and an analog switch that is disposed between the latch and a source line. A gate electrode of the erasing transistor is connected to the selection signal line, one of a source electrode and a drain electrode of the erasing transistor is connected to the source line, and the other thereof is connected to a fourth power source. Control nodes of the analog switch are connected to the selection signal line. More specifically, one of the two control nodes of the analog switch is directly connected to the selection signal line whereas the other thereof is electrically connected to the selection signal line through an inverter. An input node of the analog switch is connected to the latch whereas an output node thereof is connected to the source line.

A display device of the invention comprises a first gate driver having a shift register and a switch. The display device of the invention also comprises a second gate driver having a shift register and a switch. The switch is connected to a selection signal line. More specifically, the switch is, for instance, a tri-state buffer having an input node of which is connected to the shift register, a control node of which is connected to the selection signal line, and an output node of which is connected to a gate line.

A display device of the invention comprises a display area having a plurality of pixels each including a first transistor, and a light emitting element, a second transistor and a third transistor that are connected in series. The display device of the invention also comprises a source driver, a first gate driver and a second gate driver. The first gate driver and the second gate driver are disposed to face each other with the display area interposed therebetween.

The display device of the invention having the aforementioned structures further comprises a fourth transistor having one of a source electrode and a drain electrode of which is connected to a pixel electrode of the light emitting element. Both a gate electrode of the fourth transistor and the other of the source electrode and the drain electrode thereof are connected to the first power source. Alternatively, the gate electrode of the fourth transistor is connected to the first power source and the other of the source electrode and the drain electrode thereof is connected to the third power source. Instead, a third gate driver is added to the aforementioned structures so that the gate electrode of the fourth transistor is connected to the third gate driver and the other of the source electrode and the drain electrode thereof is connected to the first power source.

An element substrate of the invention corresponds to a condition of the display device having the aforementioned structures, in which the formation of a pixel electrode of the light emitting element is completed. More specifically, the element substrate corresponds to a condition in which a transistor and a pixel electrode connected to the transistor are formed over an insulating surface but an electroluminescent layer and a counter electrode are not formed yet.

According to a driving method of a display device of the invention, each of a plurality of gate selection periods comprises a first sub-gate selection period and a second sub-gate selection period. In the first sub-gate selection period, in accordance with a WE signal transmitted from a selection signal line, a switch included in a first gate driver is brought into an operating state while a switch included in a second gate driver is brought into a floating state, and thereby a gate line is selected by the first gate driver. In addition, one of the potentials of a source electrode and a drain electrode of an erasing transistor included in a source driver is transmitted to a gate electrode of a third transistor, thus potentials of two electrodes of a light emitting element become equal to each other. That is, no current flows between the two electrodes of the light emitting element, and an erasing operation is performed so that the light emitting element emits no light.

On the other hand, in the second sub-gate selection period, in accordance with the WE signal transmitted from the selection signal line, the switch included in the first gate driver is brought into a floating state while the switch included in the second gate driver is brought into an operating state, and thereby the gate line is selected by the second gate driver. In addition, a potential of a video signal held in a latch is transmitted to the gate electrode of the third transistor. Then, the potentials of the two electrodes of the light emitting element become different from or equal to each other in accordance with the potential of the video signal. That is, whether a current flows between the two electrodes of the light emitting element or not is determined by the video signal, and a writing operation is performed so that the light emitting element emits light or no light.

According to a driving method of a display device of the invention, one frame period is divided into a plurality of sub-frame periods each including a writing period and a light emitting period. The writing period is divided into a plurality of gate selection periods each including a first sub-gate selection period and a second sub-gate selection period.

In addition, the frequency of a WE signal transmitted from the selection signal line is twice as high as that of a clock signal inputted to the first gate driver and the second gate driver.

According to the invention having the aforementioned structures, a gate-source voltage of a driving TFT is not changed due to capacitive coupling of a gate electrode of the driving TFT and other nodes, thus variations in current value supplied to a light emitting element can be suppressed. As a result, defects such as inverted gray scale can be reduced, resulting in higher image quality.

Further, a structure in which one pixel comprises three transistors is effective from the point of view of the layout, which results in high aperture ratio and high definition. In addition, a structure having a transistor for applying a reverse bias allows to improve the degradation of a light emitting element.

BRIEF DESCRIPTION OF THE DRAWINGS

FIGS. 11A and 11B are diagrams showing Embodiment 4 of the invention.

DETAILED DESCRIPTION OF THE INVENTION

Figure 1A:
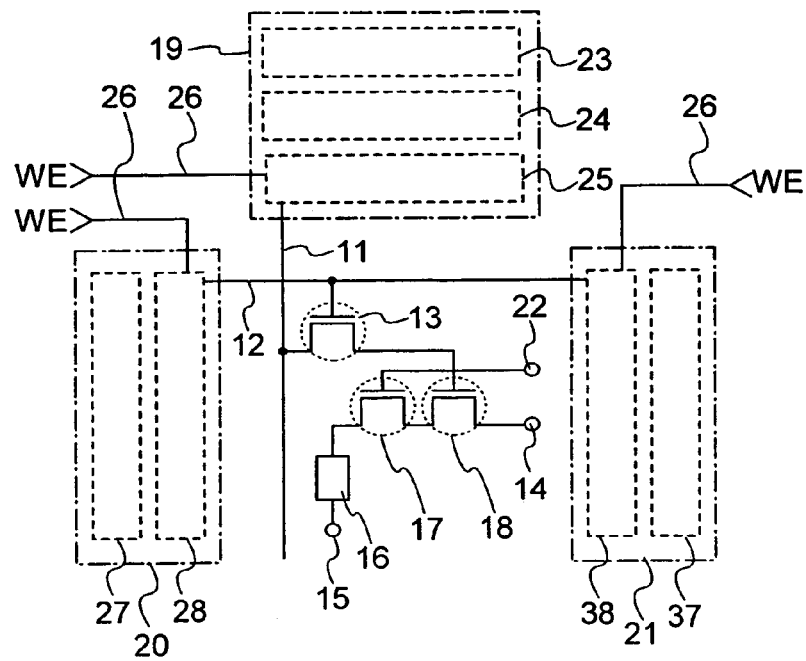
FIGS. 1A to 1C are diagrams showing a structure of a display device of the invention.
Figure 1B:
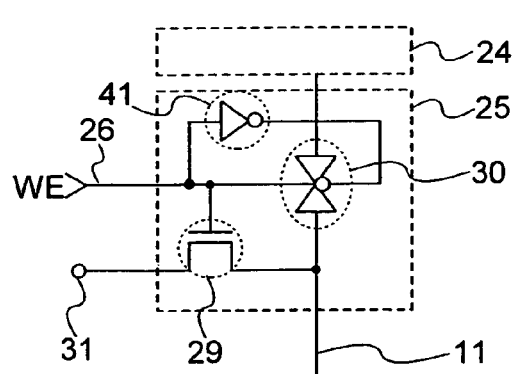

Although the invention will be fully described by way of Embodiment Modes and Embodiments with reference to the accompanying drawings, it is to be understood that various changes and modifications will be apparent to those skilled in the art. Therefore, unless such changes and modifications depart from the scope of the invention, they should be constructed as being included therein. It is noted that the same portions are denoted by the same reference numerals in different drawings.

Embodiment Mode 1

A structure of a display device of the invention is described first. The display device of the invention comprises a display area 34 in which a plurality of source lines S1 to Sm (m is a natural number) and a plurality of gate lines G1 to Gn (n is a natural number) are arranged in matrix (FIGS. 1A to 1C and FIG. 2). The display area 34 comprises a plurality of pixels 33 each including a plurality of elements at an intersection of a source line Sx (x is a natural number, $1 \leq x \leq m$) and a gate line Gy (y is a natural number, $1 \leq y \leq n$) with an insulator interposed therebetween.

The pixel 33 comprises a light emitting element 16 and three transistors (FIG. 1A). The three transistors include a first transistor 13 for controlling a video signal input (hereinafter referred to as a switching TFT 13), a second transistor 17 for determining a current value flowing to the light emitting element 16 (hereinafter referred to as a driving TFT 17), and a third transistor 18 for determining light emission or non-light emission of the light emitting element 16 depending on a video signal (hereinafter referred to as a current controlling TFT 18). A gate electrode of the switching TFT 13 is connected to a gate line 12, one of a source electrode and a drain electrode thereof is connected to a source line 11, and the other is connected to a gate electrode of the current controlling TFT 18. A gate electrode of the driving TFT 17 is connected to a third power source 22, one of a source electrode and a drain electrode thereof is connected to a pixel electrode of the light emitting element 16, and the other is connected to one of a source electrode and a drain electrode of the current controlling TFT 18. The other of the source electrode and the drain electrode of the current controlling TFT 18 is connected to a first power source 14. A counter electrode of the light emitting element 16 is connected to a second power source 15.

The conductivity type of the switching TFT 13 is not limited, and either an N-type TFT or a P-type TFT may be employed. Further, the conductivity type of the driving TFT 17 and the current controlling TFT 18 is not limited either, though they preferably have the same conductivity type. In addition, it is desirable that the driving TFT 17 operates in a saturation region while the current controlling TFT 18 operates in a linear region. In order to this, the channel length $L_1$ and the channel width $W_1$ of the driving TFT 17, and the channel length $L_2$ and the channel width $W_2$ of the current controlling TFT 18 may be formed so as to satisf $L_1/W_1$: $L_2/W_2 = 5$ to $6000:1$.

It is noted that FIGS. 1A and 1B, FIG. 2, and FIGS. 5A to 5E show the case in which N-type transistors are used for the transistors included in the pixel 33. However, as described above, the conductivity type of the transistors is not limited to the N-type and either P-type transistors or N-type transistors may be employed. Though, an N-type transistor with low off current and high on current is preferably used for the switching TFT 13. In the drawings, power sources such as the first power source 14, the second power source 15 and the third power source 22 are indicated by outline circles.

Potentials of the first power source 14 and the second power source 15 are not especially limited, though they are set to be different potentials so as to have a potential difference therebetween. A potential of the third power source 22 is required to be a potential that can turn on the driving TFT 17. Accordingly, the potential of the third power source 22 is H level when the driving TFT 17 is an N-type TFT whereas it is L level when the driving TFT 17 is a P-type TFT.

According to the aforementioned structures, gate capacitance of the current controlling TFT 18 is used as a capacitor for holding a gate-source voltage of the current controlling TFT 18. Alternatively, a capacitor element may be provided if necessary to hold a gate-source voltage of the current controlling TFT 18.

Figure 5A:
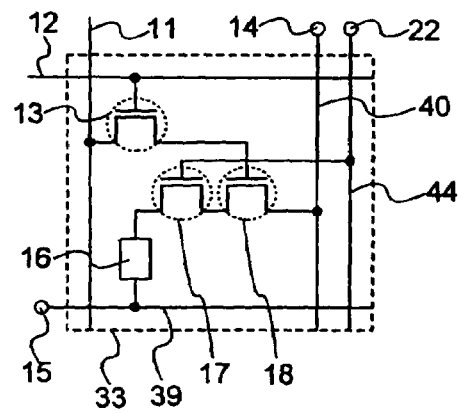
FIGS. 5A to 5E are diagrams showing Embodiment Mode 2 of the invention.

Each of the first to third power sources 14, 15 and 22 is provided outside the panel, and connected to each electrode through a wiring (conductor). Explanation is now made on an equivalent circuit in the case of a wiring connected to each power source being provided (FIG. 5A). The gate electrode of the driving TFT 17 is connected to the third power source 22 through a power source line 44. One of the source electrode and the drain electrode of the current controlling TFT 18 is connected to the first power source 14 through a power source line 40. The counter electrode of the light emitting element 16 is connected to the second power source 15 through a power source line 39.

According to the invention having the pixel circuit with the aforementioned structures, a gate-source voltage of the current controlling TFT 18 is not changed, which reduces defects such as inverted gray scale. In addition, the layout of the pixel 33 is effective since it includes three transistors, resulting in high aperture ratio and high definition.

The display device of the invention further comprises a source driver 19, and a first gate driver 20 and a second gate driver 21 that are disposed to face each other with the display area 34 interposed therebetween (FIGS. 1A to 1C and FIG. 2). The source driver 19 comprises a shift register 23, a latch 24 and a switch 25. The latch 24 includes a first latch 35 and a second latch 36. The switch 25 includes a fifth transistor 29 (hereinafter referred to as an erasing transistor 29) and an analog switch 30. The erasing transistor 29 and the analog switch 30 are provided for each column corresponding to each source line Sx. A gate electrode of the erasing transistor 29 is connected to a selection signal line 26, one of a source electrode and a drain electrode thereof is connected to the source line Sx, and the other is connected to a fourth power source 31. The analog switch 30 is disposed between the second latch 36 and the source line Sx. That is, an input node of the analog switch 30 is connected to the latch 24 whereas an output node thereof is connected to the source line Sx. One of two control nodes of the analog switch 30 is connected to the selection signal line 26 whereas the other is connected to the selection signal line 26 through an inverter 41. A potential of the fourth power source 31 is required to be a potential that can turn off the current controlling TFT 18 included in the pixel 33. Accordingly, the potential of the fourth power source 31 is L level when the current controlling TFT 18 is an N-type TFT whereas it is H level when the current controlling TFT 18 is a P-type TFT.

Figure 1C:
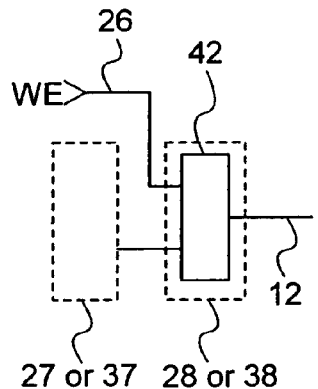
Figure 2:
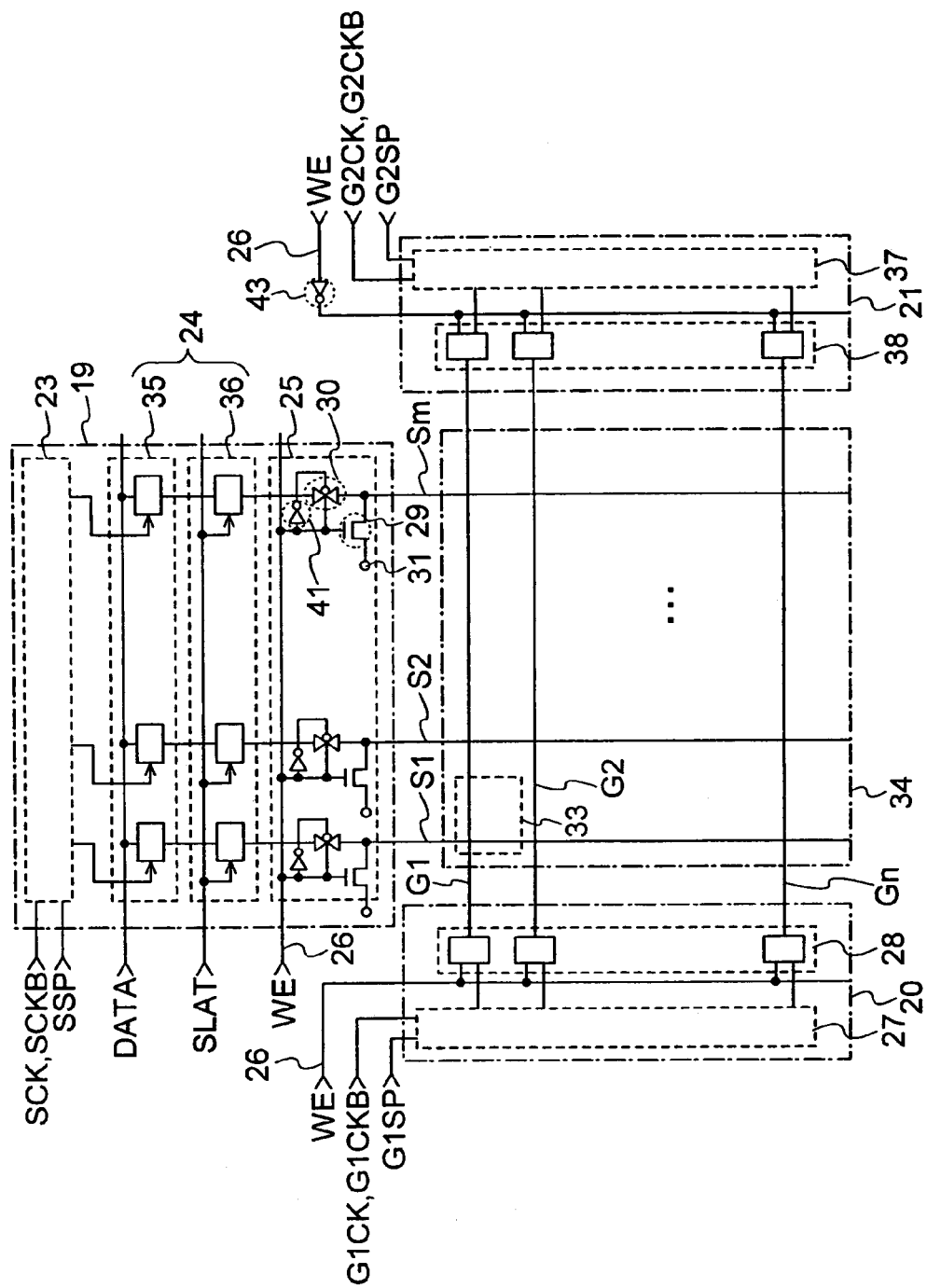
FIG. 2 is a diagram showing Embodiment Mode 1 of the invention.
Figure 3:
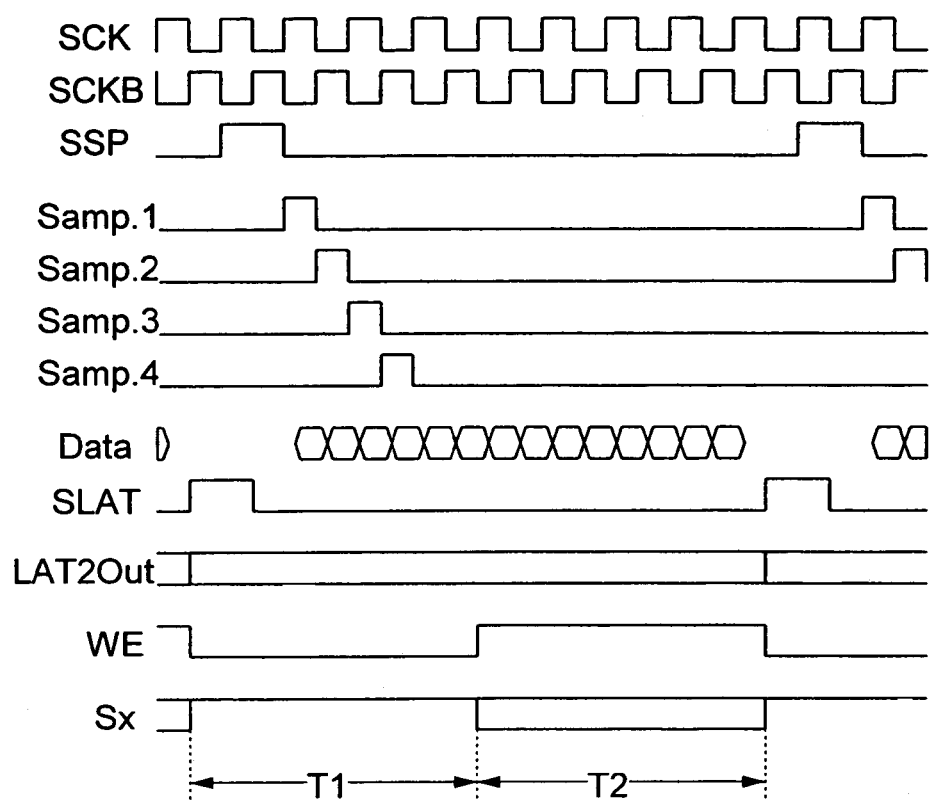
FIG. 3 is a diagram showing Embodiment Mode 1 of the invention.

The first gate driver 20 comprises a shift register 27 and a switch 28. The second gate driver 21 comprises a shift register 37 and a switch 38 (FIG. 1C and FIG. 2). The switches 28 and 38 are connected to the selection signal line 26, though the switch 38 is connected the selection signal line 26 through an inverter 43. That is, inverted signals are inputted to the switches 28 and 38.

Each of the switches 28 and 38 corresponds to a tri-state buffer. An input node of the tri-state buffer is connected to the shift register 27 or the shift register 37 whereas a control node thereof is connected to the selection signal line 26. An output node of the tri-state buffer is connected to the gate line Gy. The tri-state buffer is brought into an operating state when a signal transmitted from the selection signal line 26 is H level while into a floating state when a signal transmitted from the selection signal line 26 is L level. A structure example of the tri-state buffer is described more specifically in Embodiment 2.

It is noted that the structure of the source driver 19 is not limited to the aforementioned one, and a level shifter and a buffer may be provided between the second latch 36 and the switch 25. Similarly, the structures of the first gate driver 20 and the second gate driver 21 are not limited to the aforementioned ones, and a level shifter and a buffer may be provided between the shift register 27 and the switch 28.

In the display device having the aforementioned structures, the invention provides an element substrate that corresponds to a condition in which the formation of the pixel electrode of the light emitting element 16 is completed. More specifically, the element substrate corresponds to a condition in which a transistor and a pixel electrode connected to the transistor are formed on an insulating surface but an electroluminescent layer and a counter electrode are not formed yet.

Described next is an operation of the display device of the invention having the aforementioned structures. First, an operation of the source driver 19 is explained (FIGS. 1A to 1C, FIG. 2 and FIG. 3). A clock signal (hereinafter referred to as SCK), an inverted clock signal (hereinafter referred to as SCKB) and a start pulse (hereinafter referred to as SSP) are inputted to the shift register 23, and the shift register 23 outputs a sampling pulse to the first latch 35 in accordance with the timing of these signals. The first latch 35 inputted with data holds video signals in the first to the last columns in accordance with the timing of the inputted sampling pulse. When a latch pulse is inputted, the video signals held from the first latch 35 are simultaneously transferred to the second latch 36.

Explanation is hereinafter made on an operation of the switch 25 in each period on the assumption that T1 is a period during which a WE signal transmitted from the selection signal line 26 is L level and T2 is a period during which the WE signal is H level. Each of the periods T1 and T2 corresponds to a half horizontal scan period, and the period T1 is referred to as a first sub-gate selection period whereas the period T2 is referred to a second sub-gate selection period.

In the period T1 (first sub-gate selection period), a WE signal transmitted from the selection signal line 26 is L level, the erasing TFT 29 is on-state, and the analog switch 30 is in a non-conductive state. Thus, the plurality of source lines Sl to Sm are electrically connected to the fourth power source 31 through the erasing TFT 29 disposed in each column. In other words, the plurality of source lines Sl to Sm come to have the same potential as the fourth power source 31. At this time, the switching TFT 13 in the pixel 33 is on-state, and a potential of the fourth power source 31 is transmitted to the gate electrode of the current controlling TFT 18 through the switching TFT 13. Then, the current controlling TFT 18 is turned off and the two electrodes of the light emitting element 16 come to have the same potential. That is, no current flows between the two electrodes of the light emitting element 16 and no light is emitted. Such an operation is referred to as an erasing operation, in which the potential of the fourth current source 31 is transmitted to the gate electrode of the current controlling TFT 18, the current controlling TFT 18 is turned off, and the two electrodes of the light emitting element 16 come to have the same potential.

In the period T2 (second sub-gate selection period), a WE signal transmitted from the selection signal line 26 is H level, the erasing TFT 29 is off-state, and the analog switch 30 is in a conductive state. Thus, video signals of one row held in the second latch 36 are simultaneously transferred to the plurality of source lines S1 to Sm. At this time, the switching TFT 13 in the pixel 33 is on-state and the video signal is transmitted to the gate electrode of the current controlling TFT 18 through the switching TFT 13. Then, the current controlling TFT 18 is turned on or off in accordance with the inputted video signal, and the two electrodes of the light emitting element 16 come to have different potentials or the same potential. More specifically, when the current controlling TFT 18 is turned on, the two electrodes of the light emitting element 16 come to have different potentials and a current flows into the light emitting element 16, that is, the light emitting element 16 emits light. On the other hand, when the current controlling TFT 18 is turned off, the two electrodes of the light emitting element 16 come to have the same potential, and no current flows into the light emitting element 16, that is, the light emitting element 16 emits no light. Such an operation is referred to as a writing operation, in which the current controlling TFT 18 is turned on or off in accordance with the video signal, and the two electrodes of the light emitting element 16 come to have different potentials or the same potential.

Figure 4:
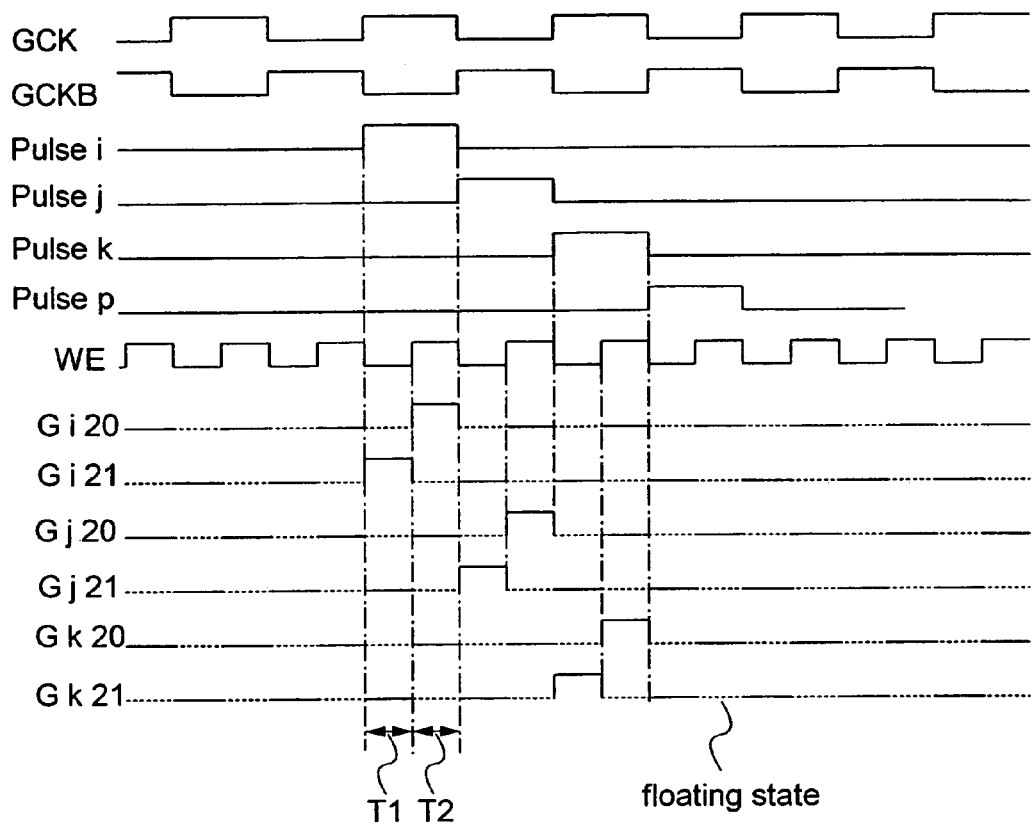
FIG. 4 is a diagram showing Embodiment Mode 1 of the invention.

Explanation is next made on an operation of the first gate driver 20 and the second gate driver 21 (FIGS. 1A to 1C, FIG. 2 and FIG. 4). The shift register 27 is inputted with a G1CK, a G1CKB and a G1SP, and sequentially outputs pulses to the switch 28 in accordance with the timing of these signals. The shift register 37 is inputted with a G2CK, G2CKB and G2SP, and sequentially outputs pulses to the switch 38 in accordance with the timing of these signals. FIG. 4 shows potentials of pulses supplied to the switches 28 and 38 in each of the i-th, j-th, k-th, and p-th rows (i, j, k, and p are natural numbers, $1 \leq i, j, k$ and $p \leq n$).

Similarly to the explanation of the operation of the source driver 19, explanation is made on operations of the switch 28 in the first gate driver 20 and the switch 38 in the second gate driver 21 in each period on the assumption that T1 is a period during which a WE signal transmitted from the selection signal line 26 is L level and T2 is a period during which the WE signal is H level. It is noted in the timing chart of FIG. 4, Gy20 (y is a natural number, $1 \leq y \leq n$) denotes a potential of a gate line Gy to which a signal is transmitted from the first gate driver 20, while Gy21 denotes a potential of a gate line Gy to which a signal is transmitted from the second gate driver 21. It is needless to say that the Gy20 and the Gy21 denote the same wiring.

In the period T1 (first sub-gate selection period), a WE signal transmitted from the selection signal line 26 is L level. The WE signal as an L level signal is inputted to the switch 28 in the first gate driver 20, thereby the switch 28 is brought into a floating state. On the other hand, an inverted WE signal, namely an H level signal is inputted to the switch 38 in the second gate driver 21, thereby the switch 38 is brought into an operating state. That is, the switch 38 transmits an H level signal (row selection signal) to a gate line Gi21 in the i-th row, and the gate line Gi comes to have the same potential as the H level signal. In other words, the gate line Gi in the i-th row is selected by the second gate driver 21. Thus, the switching TFT 13 in the pixel 33 is turned on. Then, a potential of the fourth power source 31 in the source driver 19 is transmitted to the gate electrode of the current controlling TFT 18 and the current controlling TFT 18 is turned off, thereby the two electrodes of the light emitting element 16 come to have the same potential. That is, in this period, an erasing operation is performed in which the light emitting element 16 emits no light.

In the period T2 (second sub-gate selection period), a WE signal transmitted from the selection signal line 26 is H level. Thus, the WE signal as an H level signal is inputted to the switch 28 in the first gate driver 20, thereby the switch 28 is brought into an operating state. That is, the switch 28 transmits an H level signal to a gate line Gi20 in the i-th row, and the gate line Gi comes to have the same potential as the H level signal. In other words, the gate line Gi in the i-th row is selected by the first gate driver 20. Thus, the switching TFT 13 in the pixel 33 is turned on. Then, a video signal is transmitted from the second latch 36 in the source driver 19 to the gate electrode of the current controlling TFT 18, and the current controlling TFT 18 is turned on or off, thereby the two electrodes of the light emitting element 16 come to have different potentials or the same potential. That is, in this period, a writing operation is performed in which the light emitting element 16 emits light or no light. On the other hand, the switch 38 in the second gate driver 21 is inputted with an L level signal and brought into a floating state.

As set forth above, the gate line Gy is selected by the first gate driver 20 in the period T1 (first sub-gate selection period) while selected by the second gate driver 21 in the period T2 (second sub-gate selection period). In other words, the gate line is controlled by the first gate driver 20 and the second gate driver 21 in a complementary manner. The erasing operation is performed in either of the first sub-gate selection period or the second sub-gate selection period, and the writing operation is performed in the other thereof.

In the period during which the first gate driver 20 selects the gate line Gi in the i-th row, the second gate driver 21 does not operate (the switch 38 is in a floating state) or transmits a row selection signal to the gate lines other than the gate line in the i-th row. Similarly, in the period during which the second gate driver 21 transmits a row selection signal to the gate line Gi in the i-th row, the first gate driver 20 is in a floating state or transmits a row selection signal to the gate lines other than the gate line in the i-th row.

According to the invention performing the aforementioned operation, the light emitting element 16 can be forcibly turned off without providing a TFT for discharging a potential between both electrodes of a capacitor that holds a gate-source voltage of the current controlling TFT 18. As a result, increased duty ratio can be achieved.

It is noted that the invention is not limited to the aforementioned structure in which a gate selection period is divided into two periods. As disclosed in Japanese Patent Laid-Open No. 2001-324958, one gate selection period may be divided into three periods or more.

Embodiment Mode 2

Described in this embodiment mode is a circuit structure of the pixel 33 additionally provided with a transistor for applying a reverse bias to the light emitting element 16.

Figure 5B:
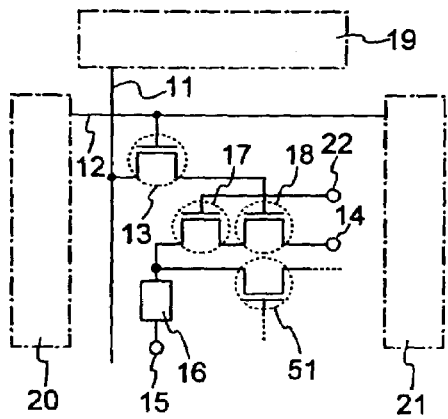

The pixel 33 comprises the light emitting element 16 and four transistors. The four transistors include the switching TFT 13 for controlling a video signal input, the driving TFT 17 for determining a current value flowing into the light emitting element 16, the current controlling TFT 18 for determining light emission or non-light emission of the light emitting element 16 in accordance with a video signal, and a fourth transistor 51 for applying a reverse bias to the light emitting element 16 (hereinafter referred to as a reverse biasing TFT 51, also called a reverse direction biasing TFT and an AC TFT) (FIG. 5B).

The reverse biasing TFT 51 is provided for applying between the two electrodes of the light emitting element 16 a reverse bias voltage having a reverse potential difference from a forward bias voltage applied in a normal light emission. When the reverse biasing TFT 51 is turned on, the pixel electrode of the light emitting element 16 is electrically connected to a power source line whose potential is set to be lower than that of the counter electrode of the light emitting element 16. In addition, at this time, the counter electrode of the light emitting element 16 is set to have a higher potential than that of the normal operation. According to such an operation, a reverse bias is applied to the light emitting element 16.

The gate electrode of the switching TFT 13 is connected to the gate line 12, one of the source electrode and the drain electrode thereof is connected to the source line 11, and the other is connected to the gate electrode of the current controlling TFT 18. The gate electrode of the driving TFT 17 is connected to the third power source 22, one of the source electrode and the drain electrode thereof is connected to the pixel electrode of the light emitting element 16, and the other is connected to one of the source electrode and the drain electrode of the current controlling TFT 18. The other of the source electrode and the drain electrode of the current controlling TFT 18 is connected to the first power source 14. One of a source electrode and a drain electrode of the reverse biasing TFT 51 is connected to the pixel electrode of the light emitting element 16.

Figure 5C:
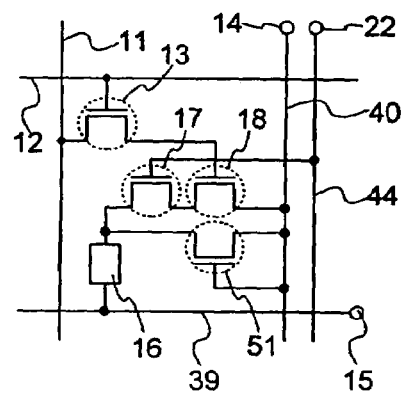
Figure 5D:
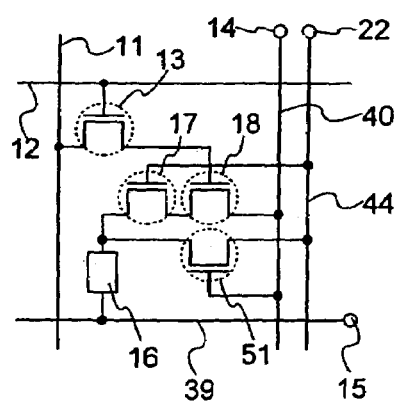
Figure 5E:
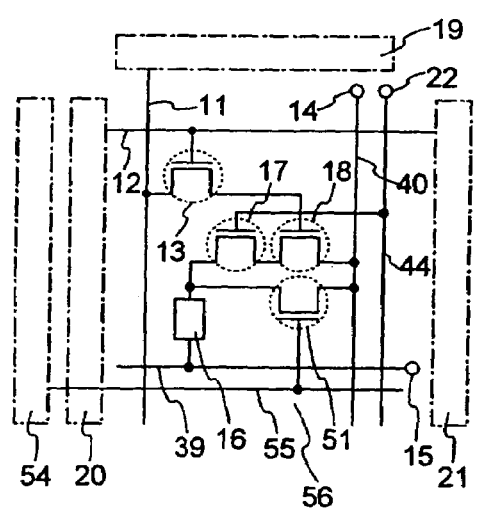

Each of the first to third power sources 14, 15 and 22 is provided outside the panel and connected to each electrode through a wiring. Explanation is hereinafter made on a structure in which a wiring connected to each power source is provided (FIGS. 5C to 5E). The gate electrode of the driving TFT 17 is connected to the third power source 22 through the power source line 44. One of the source electrode and the drain electrode of the current controlling TFT 18 is connected to the first power source 14 through the power source line 40. The counter electrode of the light emitting element 16 is connected to the second power source 15 through the power source line 39.

The gate electrode of the reverse biasing TFT 51 and the other of the source electrode and the drain electrode thereof are connected in the following three manners. According to a first manner, the gate electrode of the reverse biasing TFT 51 and the other of the source electrode and the drain electrode thereof are both connected to the first power source 14 through the power source line 40 (FIG. 5C). According to a second manner, the gate electrode of the reverse biasing TFT 51 is connected to the first power source 14 through the power source line 40, whereas the other of the source electrode and the drain electrode thereof is connected to the third power source 22 through the power source line 44 (FIG. 5D).

In the aforementioned two cases, the reverse biasing TFT 51 is off-state except when applying a reverse bias. In other words, the reverse biasing TFT 51 is required to be a TFT that is turned off by a potential of the first power source 14. Therefore, in the case of the potential of the first power source 14 being H level, the reverse biasing TFT 51 is a P-type TFT. On the other hand, in the case of the potential of the first power source 14 being L level, the reverse biasing TFT 51 is an N-type TFT.

It is noted that the structures shown in FIGS. 5C and 5D are just examples and other connections may be adopted as well. For example, one of the source electrode and the drain electrode of the reverse biasing TFT 51 is connected to the third power source 22 through the power source line 44, however, it may be connected to the source line 11 instead. Further, according to the structures shown in FIGS. 5C and 5D, the reverse biasing TFT 51 is controlled by the first power source 14 connected through the power source line 40. In that case, when a reverse bias is applied to the light emitting element 16, the potentials of the first power source 14 and the third power source 22 are set to be lower than those of the normal operation. Thus, the reverse biasing TFT 51 is simultaneously turned on in all the pixels, thereby a reverse bias is applied to the light emitting element 16.

According to a third manner, a third gate driver 54 and a gate line 55 are additionally provided (FIG. 5E). In that case, the gate electrode of the reverse biasing TFT 51 is connected to the third gate driver 54 through the gate line 55, and the other of the source electrode and the drain electrode thereof is connected to the first power source 14 through the power source line 40. The conductivity type of the reverse biasing TFT 51 is not especially limited in this case.

Figure 15:
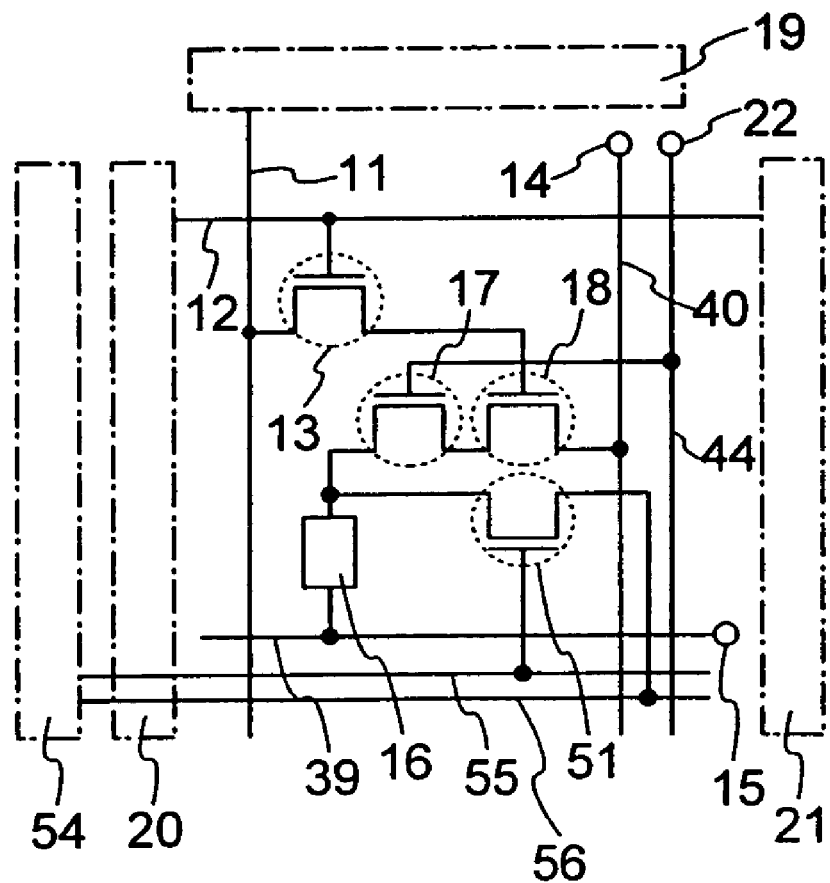
FIG. 15 is a diagram showing Embodiment Mode 2 of the invention.

Alternatively, the third gate driver 54, the gate line 55 and a power source line 56 may be provided in addition to the aforementioned three cases (FIG. 15). In that case, the other of the source electrode and the drain electrode of the reverse biasing TFT 51 is connected to the power source line 56. The third gate driver 54 controls the gate line 55 and the power source line 56. That is, by controlling the gate line 55 and the power source line 56 by the third gate driver 54, a reverse bias can be sequentially applied to the light emitting element 16 from the first to last rows.

The gate line 55 may be controlled by a switch so as to be simultaneously switched in all the rows. In that case, the third gate driver 54 is not required.

In addition, the other of the source electrode and the drain electrode of the reverse biasing TFT 51 is not required to be connected to the power source line 56 and may be connected to the first power source 14 through the power source line 40 as shown in FIGS. 5C and 5D.

Next, brief description is made on an operation of the pixel 0.33 having the aforementioned structures. An operation of applying a reverse bias to the light emitting element 16 is explained herein. First, an erasing operation is performed to the pixel 33 to turn off the current controlling TFT 18. Then, the reverse biasing TFT 51 is turned on, and the potentials of the first power source 14 and the second power source 15 are inverted to each other, thereby a reverse bias is applied to the light emitting element 16. The reverse biasing TFT 51 may be turned on when the potentials of the first power source 14 and the second power source 15 are inverted to each other (FIGS. 5C and 5D), or may be turned on by the third gate driver 54 (FIG. 5E).

In other words, the potentials of the first power source 14 and the second power source 15 are switched to each other, and the reverse biasing TFT 51 is turned on to apply a reverse bias to the light emitting element 16. Switching in the potentials of the first power source 14 and the second power source 15 means, for example, inverting the potentials to each other.

The structure including a transistor for applying a reverse bias allows to improve the degradation of the light emitting element. This embodiment mode can be implemented in combination with the aforementioned embodiment mode.

As an example of a defect of a light emitting element, there is a case in which both electrodes of the light emitting element are short-circuited. The short circuit occurs when a defective electroluminescent layer is formed due to dusts on the surface of a pixel electrode and projections of the pixel electrode generated in manufacturing steps of the light emitting element, and the both electrodes of the light emitting element are connected without the electroluminescent layer interposed therebetween. In such a case, a current flows into the entire light emitting element and light is emitted when a forward bias voltage is applied to the light emitting element. However, in a short-circuited portion, a current passes through between the electrodes and no light is emitted.

There is another defect in which an electroluminescent layer becomes thin due to dusts generated in manufacturing steps of a light emitting element, and the like. In that case, light is emitted in the initial stage, however, a defect similar to the short circuit occurs in a portion with a thin film thickness because it is more stressed as compared with the peripheral portion. Such a defect is progressive over actual driving time, therefore, it cannot be solved in the initial aging and the like. When a reverse bias is applied to a light emitting element, no current flows in the reverse direction since the light emitting element has rectifying properties as a diode, though a current flows in a short-circuited portion. When a current intensively flows in the short-circuited portion, the defect can be repaired by burning out the short-circuited portion and the like. As set forth above, when a reverse bias is applied to the light emitting element, short-circuited portions in an initial stage and a progressive stage can be both insulated to repair the defect. Therefore, a display device with improved reliability can be provided as well as a driving method thereof.

Embodiment 1

Explanation is made on a structure of a light emitting element that is a component of the invention. The light emitting element has a laminated structure of a conductive layer, an electroluminescent layer and a conductive layer that are formed over a substrate having an insulating surface constituted of glass, quartz, metal, organic material or the like. The light emitting element may be a laminated type including an electroluminescent layer formed of a plurality of layers, a single layer type including an electroluminescent layer formed of a single layer, or a mixed type including an electroluminescent layer formed of a plurality of layers having ill-defined boundaries. Further, the light emitting element may adopt, depending on the direction of light emission, either a forward-laminated structure in which a conductive layer corresponding to an anode, an electroluminescent layer and a conductive layer corresponding to a cathode are laminated in this order, or a reverse-laminated structure in which a conductive layer corresponding to a cathode, an electroluminescent layer and a conductive layer corresponding to an anode are laminated in this order. The electroluminescent layer may be formed of an organic material (low molecular weight, high molecular weight or medium molecular weight), an organic material combined with an inorganic material, a singlet material, a triplet material, or a combination of these materials.

Light from a light emitting element can be emitted in the following three directions: the direction of a substrate side (bottom emission); the direction of a counter substrate side (top emission); and the direction of a substrate side and a counter substrate side, that is the direction of a surface and the opposite surface of the substrate (dual emission). In the case of the dual emission, the substrate and the counter substrate are definitely needed to transmit light. The light emitted from the light emitting element includes luminescence that is generated when an excited singlet state returns to a ground state (fluorescence) and luminescence that is generated when an excited triplet state returns to a ground state (phosphorescence), one or both of which can be adopted in the invention.

It is noted that a state of light emission by a current flow into a light emitting element means a state in which a forward bias voltage is applied between both electrodes of the light emitting element.

The light emitting element can achieve a wide viewing angle, and reduced thickness and weight without requiring a backlight, and exhibit fast response that is suitable for displaying moving images. By the use of such a light emitting element, a display device with high performance and high added value can be realized. This embodiment can be implemented in combination with the aforementioned embodiment modes.

Embodiment 2

Figures 6A, 6B:
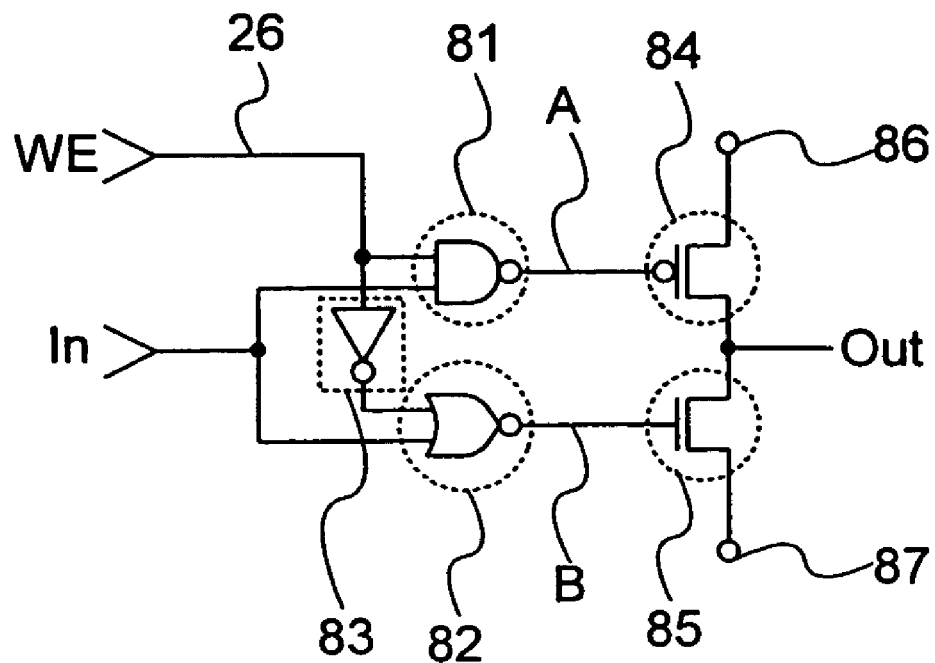
FIGS. 6A and 6B are diagrams showing Embodiment 2 of the invention.

Explanation is made on a structure of a tri-state buffer that is one example of the components of the invention. A tri-state buffer comprises a NAND 81, a NOR 82, an inverter 83, and a P-type TFT 84 and an N-type TFT 85 that are connected in series (FIG. 6A). One of two input nodes of the NAND 81 is connected to the selection signal line 26 and the other is connected to the shift register. That is, one of the two input nodes of the NAND 81 is inputted with a WE signal while the other is inputted with a pulse. One of two input nodes of the NOR 82 is connected to the selection signal line 26 through the inverter 83 and the other is connected to the shift register. That is, one of the two input nodes of the NOR 82 is inputted with an inverted WE signal while the other is inputted with a pulse. A source electrode of the P-type TFT 84 is connected to a high potential power source 86 whereas a source electrode of the N-type TFT 85 is connected to a low potential power source 87.

According to the aforementioned structure, a control node of the tri-state buffer corresponds to a node connected to the selection signal line 26, and specifically to one of the input nodes of the NAND 81 and an input node of the inverter 83. An input node of the tri-state buffer corresponds to the other of the input nodes of the NAND 81 and one of the input nodes of the NOR 82. An output node of the tri-state buffer corresponds to drains of the P-type TFT 84 and the N-type TFT 85.

It is noted that by the tri-state buffer provided at the end of the gate driver, one of the outputs can charge and discharge a gate line without being interrupted by the other of the outputs. Therefore, an analog switch, a clocked inverter or the like can be used instead to perform the same function.

A truth table as shown in the drawing is obtained on the assumption that a pulse supplied from the shift register is In, a potential of the output node of the NAND 81 is A, a potential of the output node of the NOR 82 is B, and a potential of the drain electrodes of the P-type TFT 84 and the N-type TFT 85 is OUT (FIG. 6B). This embodiment can be implemented in combination with the aforementioned embodiment modes and embodiment.

Embodiment 3

Figure 7A:
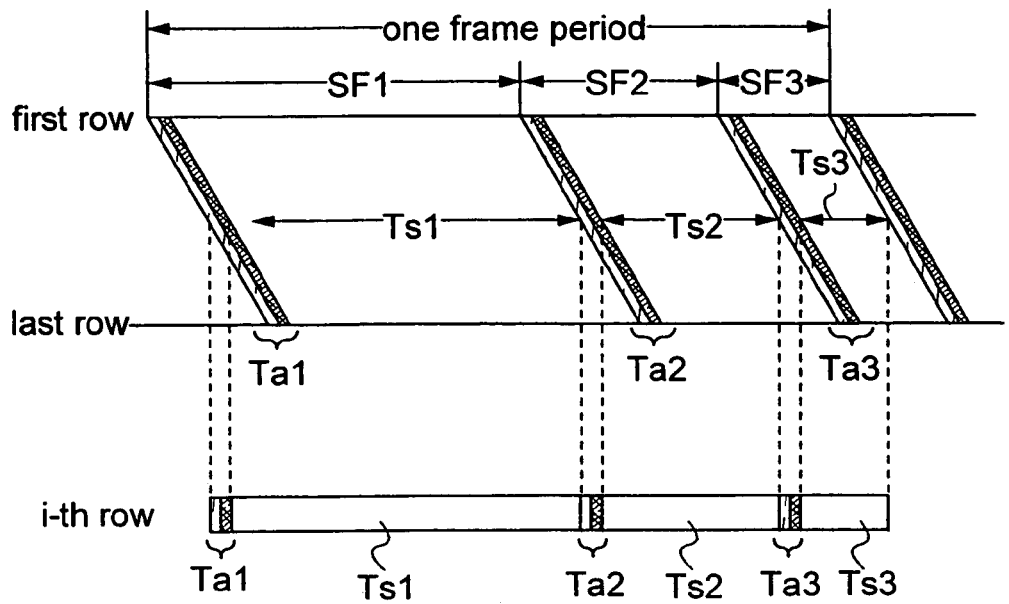
FIGS. 7A and 7B are diagrams showing Embodiment 3 of the invention.
Figure 7B:
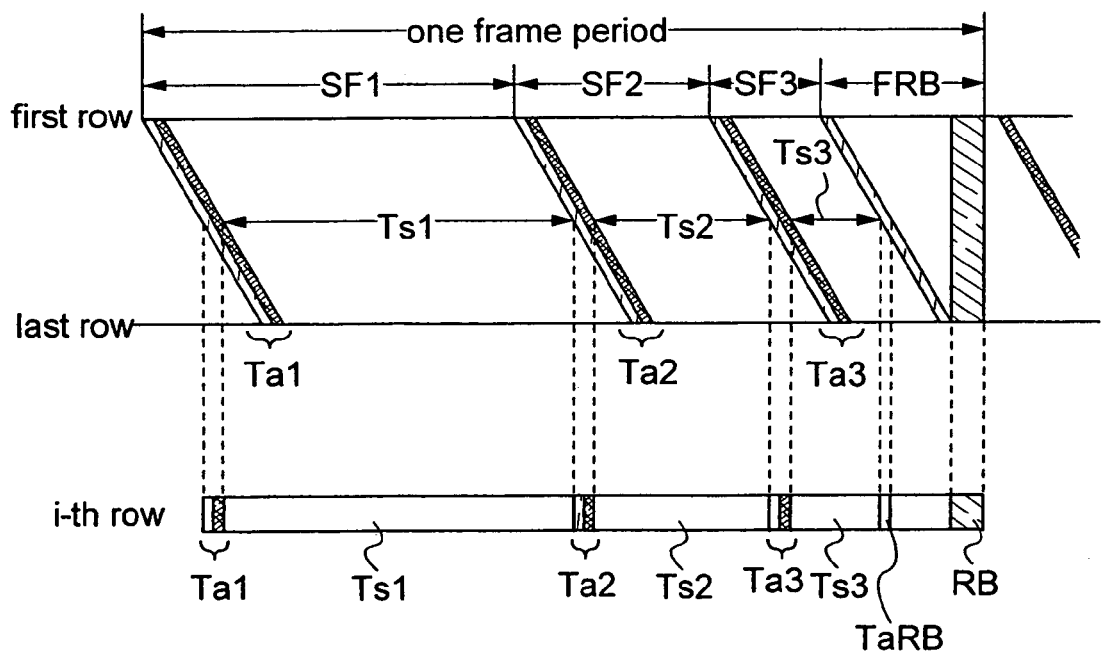

Explanation is made on a time gray scale method adopted in the display device of the invention, namely on a driving method (operation) of the display device of the invention. The description is made with reference to timing charts of which the ordinate represents a scan line and the abscissa represents time; and timing charts of a gate line Gi in the i-th row ($1 \leq i \leq n$) (FIGS. 7A and 7B). The frame frequency is about 60 Hz, and a period of writing a screen once is referred to as a frame period. According to the time gray scale method, one frame period is divided into a plurality of sub-frame periods. The number of divisions is usually equal to the number of gray scale bits, and such a case is shown in this embodiment.

It is noted that the timing charts shown in FIGS. 7A and 7B are just examples, and a sub-frame period may be further divided in order to reduce pseudo contour and the like.

First, an operation without a reverse bias applying period FRB is described (FIG. 7A). The description is made on the case of displaying 3 bits (8 gray scales), namely the case in which one frame period is divided into three sub-frame periods SF1 to SF3.

Note that the pixel shown in FIG. 5A is used in the timing charts shown in FIG. 7A.

Each sub-frame period has a writing period (also called an address period, and hereinafter referred to as an address period) Ta during which a writing operation and an erasing operation are performed, and a light emitting period (also called a sustain period and a lighting period) Ts during which a pixel emits light or no light to display an image. The address period Ta is divided into a plurality of gate selection periods each of which includes a first sub-gate selection period and a second sub-gate selection period. An erasing operation is performed in one of the first sub-gate selection period and the second sub-gate selection period, while a writing operation is performed in the other thereof. Shown in the drawings is the case in which an erasing operation is performed in the first sub-gate selection period and a writing operation is performed in the second sub-gate selection period. The length ratio of the light emitting periods Ts1 to Ts3 is such that Ts1:Ts2:Ts3=4:2:1. In the case of displaying n bits, the length ratio of n light emitting periods is $2^{(n-1)}:2^{(n-2)}:\ldots:2^1:2^0$.

In other words, the length of the light emitting period Ts differs in each bit. For example, when the ratio of the light emitting periods is equal to the power of 2, a linear gray scale with 16 gray scales can be achieved by combining the light emitting period of each bit. According to the invention, the address period is divided into the gate selection periods in each of which a writing operation or an erasing operation is performed.

Next, an operation with a reverse bias applying period FRB is described (FIG. 7B). The reverse bias applying period FRB includes an address period TARB during which only an erasing operation is performed, and a reverse bias applying period RB during which potentials of an anode and a cathode are inverted to each other to simultaneously apply a reverse bias to all the pixels. It is noted that the reverse bias applying period RB is not necessarily provided in each frame period, and may be provided in every plural frame periods. In addition, the reverse bias applying period FRB is not necessarily provided separately from the sub-frame periods SF1 to SF3, and may be provided in one of the light emitting periods Ts1 to Ts3 in the sub-frame periods.

Note that the pixels shown in FIGS. 5B to 5D are used in the timing charts shown in FIG. 7B.

The order of the sub-frame periods is not limited to the aforementioned order that is from the most significant bit to the least significant bit, and may be arranged at random in one frame period. Further, the order may be changed in every frame period. This embodiment can be implemented in combination with the aforementioned embodiment modes and embodiments.

Explanation is made on the case of displaying 4 bits (16 gray scales), namely the case in which one frame period is divided into four sub-frame periods SF1 to SF4.

Figure 10A:
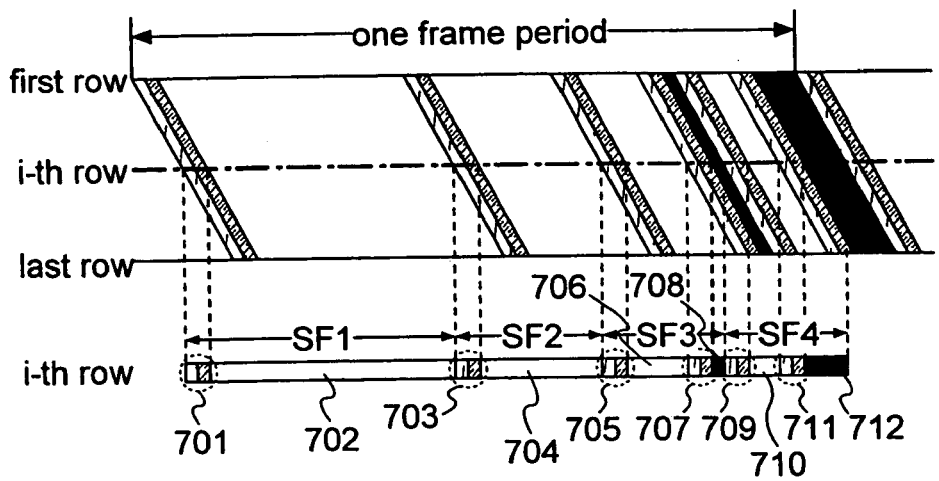
FIGS. 10A to 10C are diagrams showing Embodiment 4 of the invention.
Figure 10B:
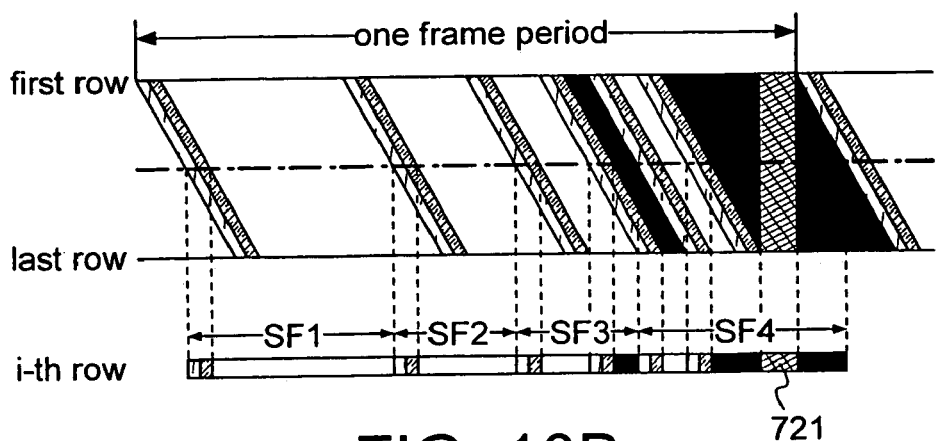

First, a timing chart using the pixel shown in FIG. 5A is described with reference to FIG. 10A. In FIG. 10A, a writing of the first bit is performed in an address period 701, and a display of the first bit is performed in a light emitting period 702. Similarly, a writing of the second bit is performed in an address period 703 and a display of the second bit is performed in a light emitting period 704. Then, a writing of the third bit is performed in an address period 705 and a display of the third bit is performed in a light emitting period 706. As for the third bit, however, an erasing operation is required before writing the fourth bit since the light emitting period 706 is short. Therefore, an erasing operation is performed in an address period 707, then a writing of the fourth bit is performed in an address period 709 after a non-light emitting period 708. The fourth bit also includes an address period 711 for erasing and a non-light emitting period 712.

A timing chart using the pixels shown in FIGS. 5B to 5D in the case of a reverse bias being applied to a light emitting element is described with reference to FIG. 11B. After the fourth bit is displayed and erased, a reverse bias is simultaneously applied to the whole screen in a period 721. Accordingly, duty ratio (total light emitting period/one frame period) is slightly reduced as compared with the case shown in FIG. 7A.

Figure 10C:
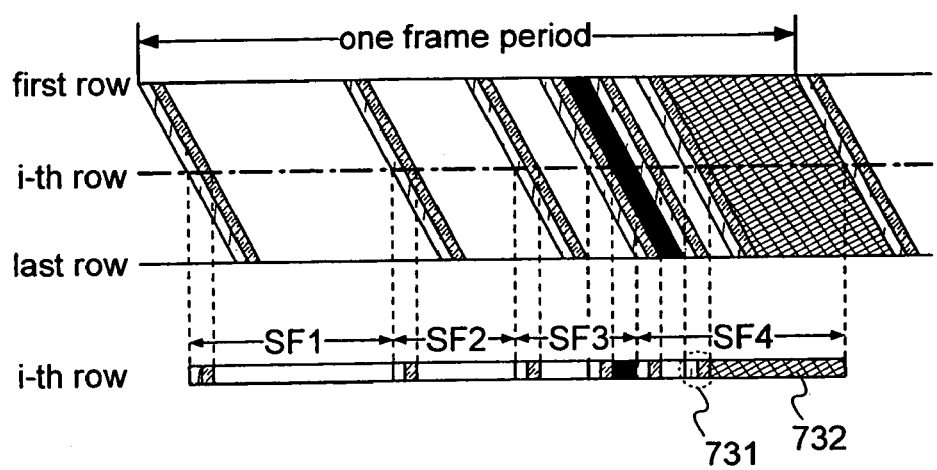

Next, a timing chart using the pixel shown in FIG. 5E in the case where timing of applying a reverse bias can be controlled for every row is described with reference to FIG. 10C. In FIG. 10C, a scan period 731 for applying a reverse bias by the use of an additionally provided third gate driver is provided after a light emitting period of the fourth bit, and a reverse bias is sequentially applied in every row (a period 732). According to this, a reverse bias can be applied more efficiently as compared with the case shown in FIG. 7B. On the contrary, in the case of a reverse bias being applied in the same length as that in FIG. 7B, duty ratio can be further increased. This embodiment can be implemented in combination with the aforementioned embodiment modes and embodiments.

Embodiment 4

Either an analog video signal or a digital video signal may be inputted to the display device of the invention. In the case of a digital video signal being inputted, the video signal may be either a voltage or a current. That is, a video signal inputted to a pixel in light emission of a light emitting element may be either a constant voltage or a constant current. In the case of a video signal being a constant voltage, a constant voltage is applied to a light emitting element or a constant current flows to the light emitting element. Also in the case of a video signal being a constant current, a constant voltage is applied to a light emitting element or a constant current flows to the light emitting element. When a constant voltage is applied to a light emitting element, a constant voltage drive is performed. Meanwhile, when a constant current flows to a light emitting element, a constant current drive is performed. According to the constant current drive, a constant current flows regardless of changes in resistance of a light emitting element. In the display device of the invention, either a voltage video signal or a current video signal may be employed as well as either the constant voltage drive or the constant current drive.

Embodiment 5

Figure 8A:
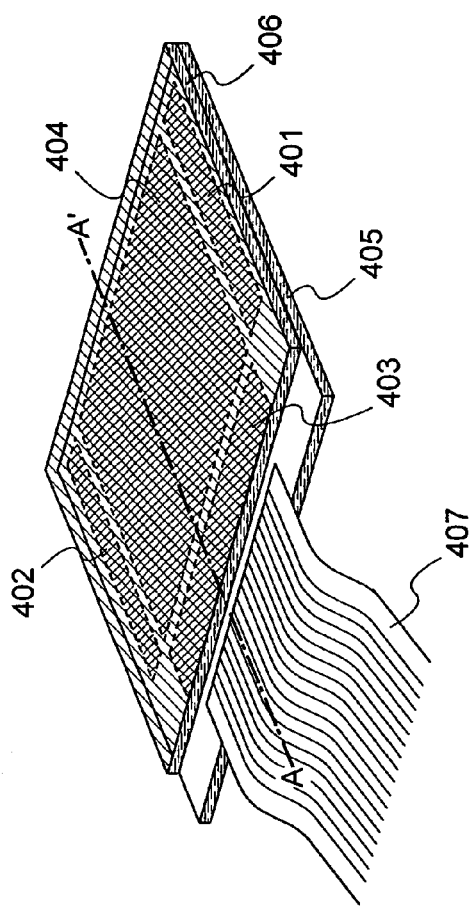
FIGS. 8A and 8B are diagrams showing Embodiment 4 of the invention.
Figure 8B:
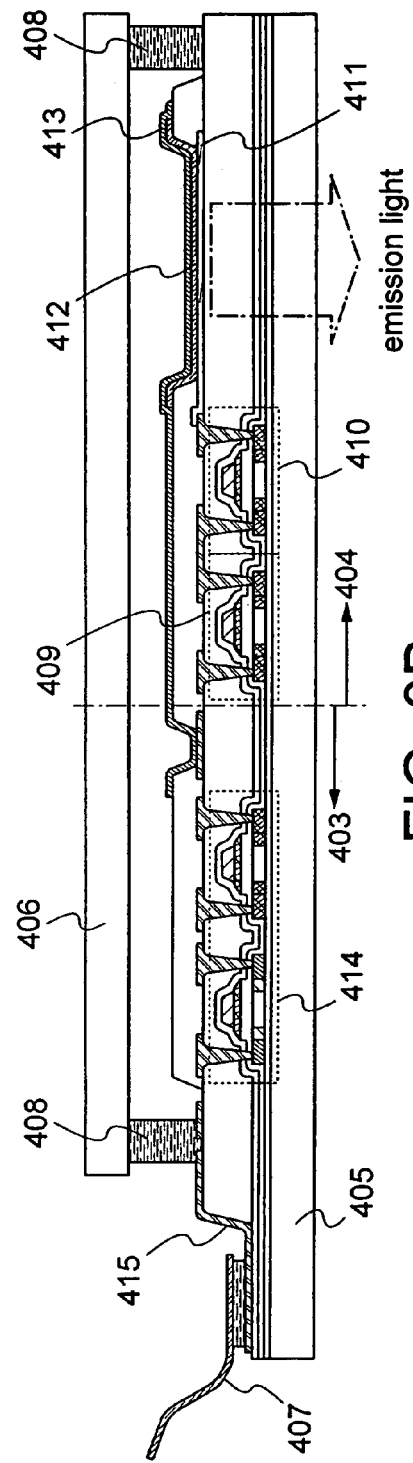

Explanation is made on a panel including a display area and a driver, which is an embodiment of the display device of the invention. Over a substrate 405, a display area 404 including a plurality of pixels each having a light emitting element, a source driver 403, a first gate driver 401, a second gate driver 402, a connecting terminal 415, and a connecting film 407 are provided (FIGS. 8A and 8B). The connecting terminal 415 is connected to the connecting film 407 through conductive particles, and the connecting film 407 is connected to an IC chip.

FIG. 8B is a cross sectional view along a line A-A' of the panel, which shows a current controlling TFT 409 and a driving TFT 410 formed in the display area 404 and a CMOS circuit 414 formed in the source driver 403. The display area 404 also comprises a conductive layer 411, an electroluminescent layer 412 and a conductive layer 413. The conductive layer 411 is connected to a source electrode or a drain electrode of the driving TFT 410. The conductive layer 411 functions as a pixel electrode whereas the conductive layer 413 functions as a counter electrode. A laminate of the conductive layer 411, the electroluminescent layer 412 and the conductive layer 413 corresponds to a light emitting element.

The display area 404 and the drivers 401 to 403 are surrounded by a sealing member 408, and the light emitting element is sealed with the sealing member 408 and a counter substrate 406. This sealing process is performed to protect the light emitting element from moisture. Although a covering material (glass, ceramics, plastic, metal or the like) is used for sealing herein, heat curable resin or UV curable resin may also be employed as well as a thin film with high barrier properties such as a metal oxide film and a nitride film.

It is preferable that elements formed over the substrate 405 are formed of crystalline semiconductor (polysilicon) that exhibits improved properties such as mobility as compared with amorphous semiconductor, thereby monolithic formation of the elements on the same surface is achieved. A panel having the aforementioned structure has a reduced number of external ICs to be connected, therefore, a small, lightweight and thin panel can be achieved.

Further, in FIG. 8B, the conductive layer 411 is formed of a transparent conductive film whereas the conductive layer 413 is formed of a reflective film. Accordingly, light from the electroluminescent layer 412 passes through the conductive layer 411 to be emitted to the substrate 405 side as shown by an arrow. Such a structure is generally called a bottom emission method.

On the other hand, when the conductive layer 411 is formed of a reflective film and the conductive layer 413 is formed of a transparent conductive film, light from the electroluminescent layer 412 can be emitted to the counter substrate 406 side as shown in FIG. 11A. Such a structure is generally called a top emission method.

Either the source electrode or the drain electrode of the driving TFT 410 and the conductive layer 411 are laminated on the same layer without an insulating layer interposed therebetween, and are directly connected by overlapped thin films. Accordingly, the conductive layer 411 is formed in an area other than the area in which the driving TFT 410 and the like are disposed, leading to a reduced aperture ratio with higher definition of a pixel. Thus, as shown in FIG. 11B, an interlayer film 416 is additionally provided and the pixel electrode is formed over an independent layer to adopt the top emission method. As a result, the area in which the TFT and the like are formed can also be used efficiently as a light emitting area. At this time, depending on the film thickness of the electroluminescent layer 412, the conductive layer 411 functioning as a pixel electrode and the conductive layer 413 may be short-circuited in a contact area between the conductive layer 411 and the source electrode or the drain electrode of the driving TFT 410. Therefore, a bank 417 or the like is preferably provided in order to prevent the short circuit.

Figure 12:
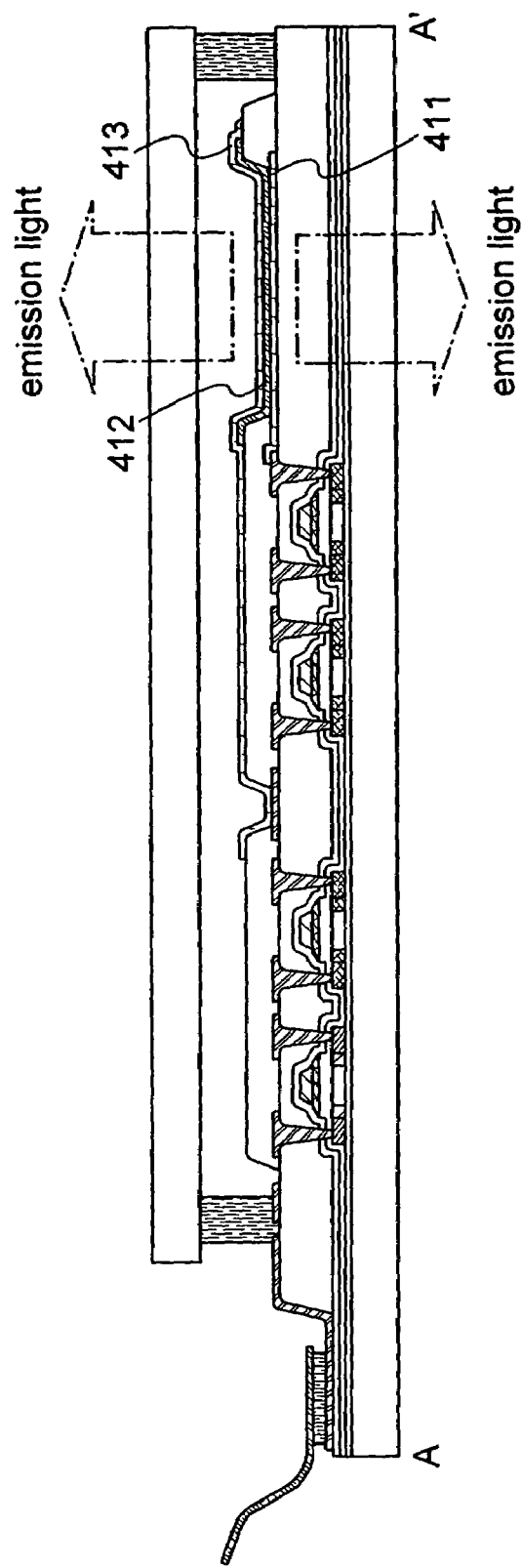
FIG. 12 is a diagram showing Embodiment 5 of the invention.

Further, when each of the conductive layer 411 and the conductive layer 413 is formed of a transparent conductive film as shown in FIG. 12, light from the electroluminescent layer 412 can be emitted to both the substrate 405 side and the counter substrate 406 side. Such a structure is called a dual emission method.

In the case of FIG. 12, a light emitting area of the top emission side is substantially equal to that of the bottom emission side. However, when the area of the pixel electrode is increased by adding the interlayer film as described above, the aperture ratio in the top emission side can be improved.

The invention is not limited to the aforementioned embodiment. For example, the display area 404 may be constituted by a TFT having a channel portion of which is formed of amorphous semiconductor (amorphous silicon) formed on an insulating surface, and the drivers 401 to 403 may be constituted by an IC chip. The IC chip may be attached on the substrate by COG, or attached to the connecting film connected to the substrate. The amorphous semiconductor is easily formed on a large substrate by CVD, and allows to provide an inexpensive panel without requiring crystallization steps. In addition, when the conductive layer is formed by a droplet ejection method typified by an ink jet method, a more inexpensive panel can be provided. This embodiment can be implemented in combination with the aforementioned embodiment modes and embodiments.

Embodiment 6

Electronic apparatuses having a display area including a light emitting element include a TV set, a digital camera, a digital video camera, a portable telephone set (portable telephone), a portable information terminal such as a PDA, a portable game machine, a monitor, a laptop personal computer, an audio reproducing device such as an in-car audio system, an image reproducing device provided with a recording medium such as a home game machine, and the like. Specific examples of them are shown below.

Figure 9A:
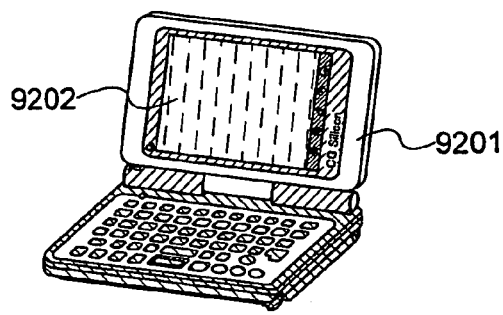
FIGS. 9A to 9F are diagrams showing Embodiment 5 of the invention.
Figure 9B:
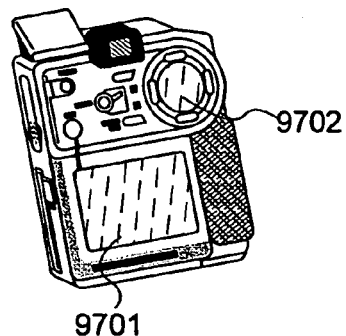
Figure 9C:
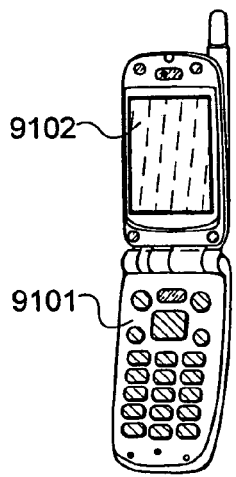
Figure 9D:
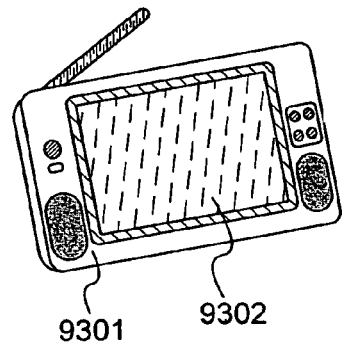
Figure 9E:
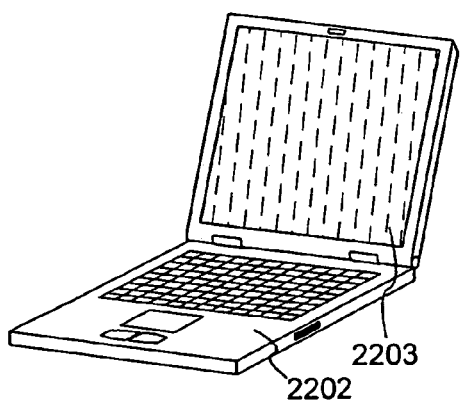
Figure 9F:
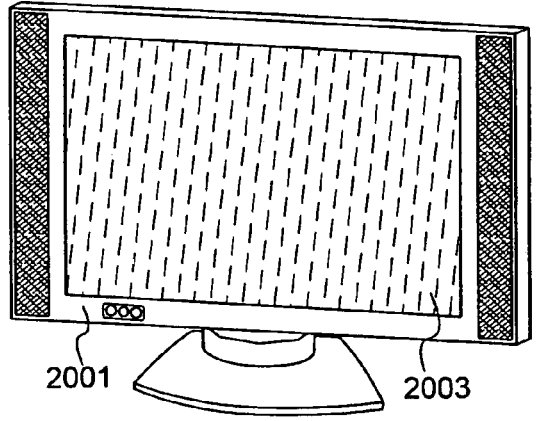

FIG. 9A illustrates a portable information terminal including a main body 9201, a display portion 9202 and the like. FIG. 9B illustrates a digital video camera including display portions 9701 and 9702 and the like. FIG. 9C illustrates a portable terminal including a main body 9101, a display portion 9102 and the like. FIG. 9D illustrates a portable TV set including a main body 9301, a display portion 9302 and the like. FIG. 9E illustrates a laptop personal computer including a main body 2202, a display portion 2203 and the like. FIG. 9F illustrates a TV set including a main body 2001, a display portion 2003 and the like. The invention is applied to a structure of such a display device including a display portion. According to the invention, higher image quality and higher definition of a display screen can be achieved, resulting in electronic apparatuses with high performance and high added value. This embodiment can be implemented in combination with the aforementioned embodiment modes and embodiments.

Embodiment 7

Figure 13A:
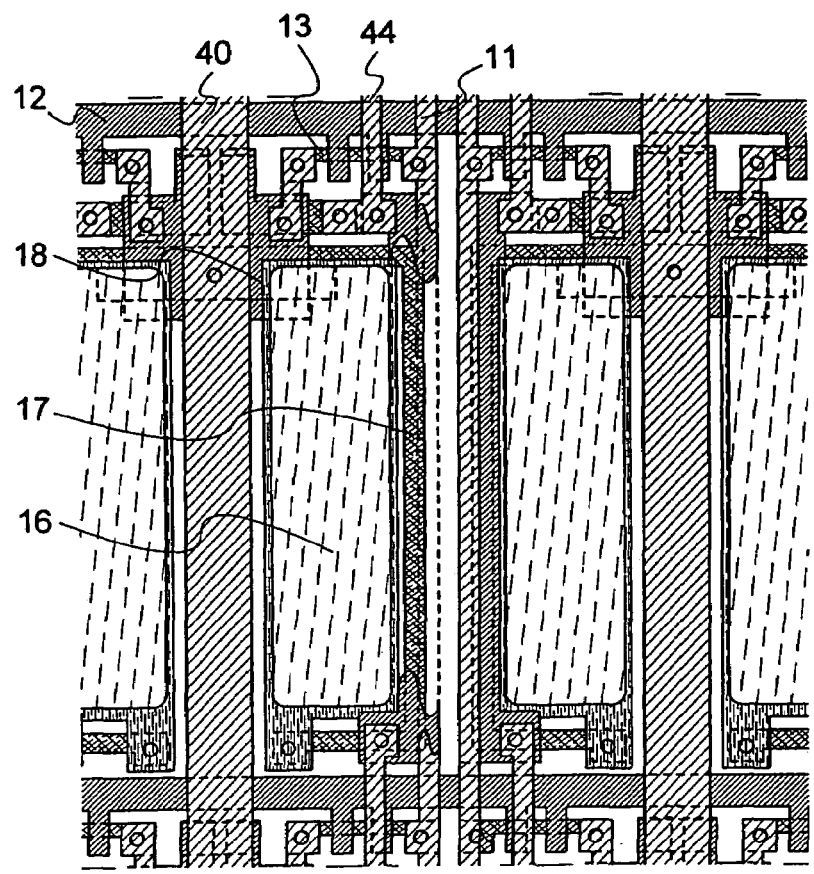
FIGS. 13A and 13B are diagrams showing Embodiment 5 of the invention.
Figure 13B:
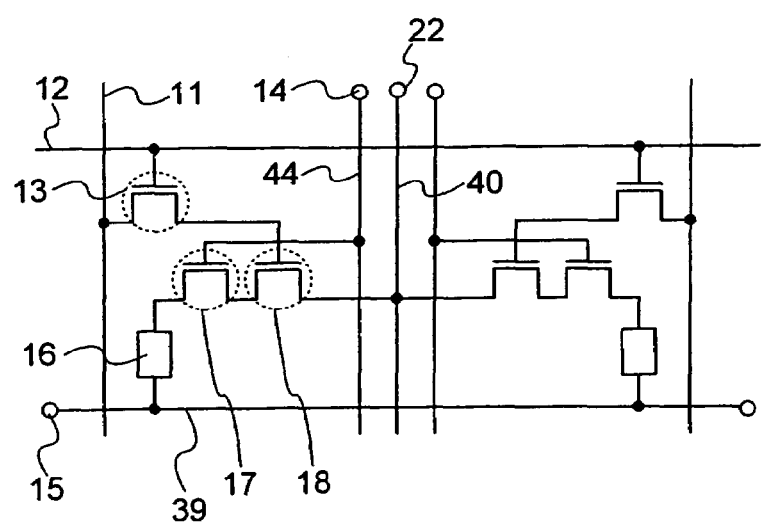

FIG. 13A shows a layout example of a pixel constituting a display device of the invention. A structure of a pixel is the same as that of the pixel shown in FIG. 5A. Though, in FIG. 13A, the power source line 40 is shared between two adjacent pixels, and a circuit diagram thereof is shown in FIG. 13B. It is noted that the second power source 15 functioning as a counter electrode is not shown in FIG. 13A.

According to the aforementioned layout, the number of wirings disposed in a display area (also referred to as a pixel area) can be reduced, resulting in improved aperture ratio.

Note that the power source line 44 may be shared between two adjacent pixels. However, it is preferable that the power source lines 40 and 44 are not shared and provided separately so as to adjust the potentials thereof independently to adjust a current value supplied to the light emitting element 16. Particularly, in the case of a color display, white balance adjustment is indispensable, therefore, the power source line shared between adjacent pixels may be appropriately selected which does not affect white balance adjustment. Specifically, in the case where a gate potential of the driving TFT 17 is changed by adjusting the potential of the power source line 44 to determine a current value supplied to the light emitting element 16, the power source line 44 cannot be shared between adjacent pixels. Meanwhile, in the case where a VGS of the driving TFT 17 is changed by adjusting the potential of the power source line 40 to determine a current value supplied to the light emitting element 16, the power source line 40 cannot be shared between adjacent pixels.

In FIG. 13A, a capacitor is provided under the power source line 40 in order to hold a potential of the gate electrode of the current controlling TFT 18. Although not shown in the circuit diagram of FIG. 13B, a capacitor may be provided if needed. According to the layout shown in FIG. 13A, the capacitor is disposed in an area of the power source line that is not used as a light emitting area, thus high performance can be achieved without reducing aperture ratio.

Figure 14A:
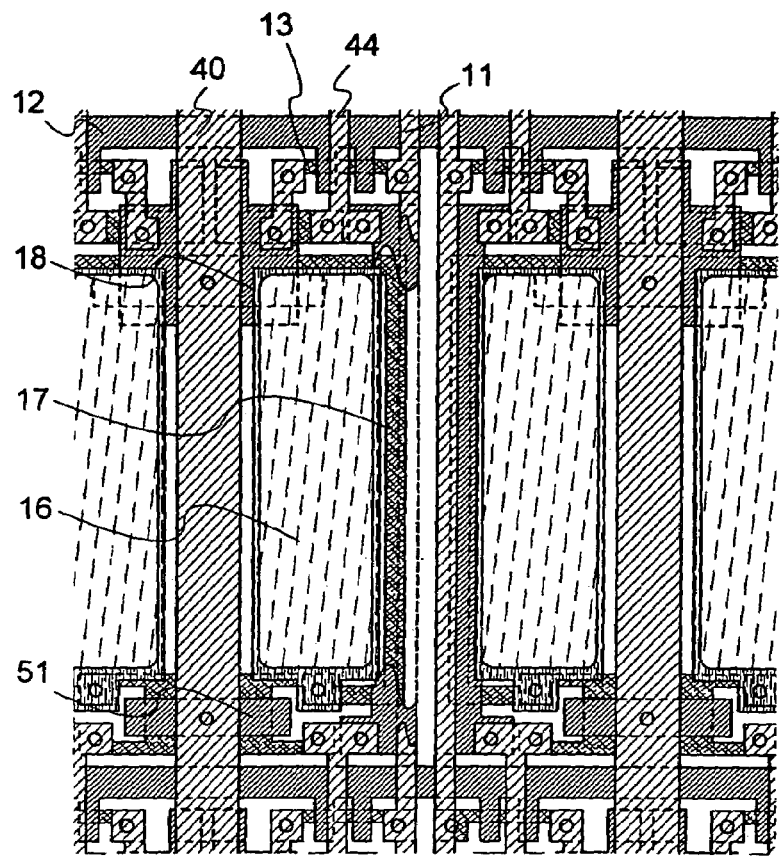
FIGS. 14A and 14B are diagrams showing Embodiment Mode 2 of the invention.
Figure 14B:
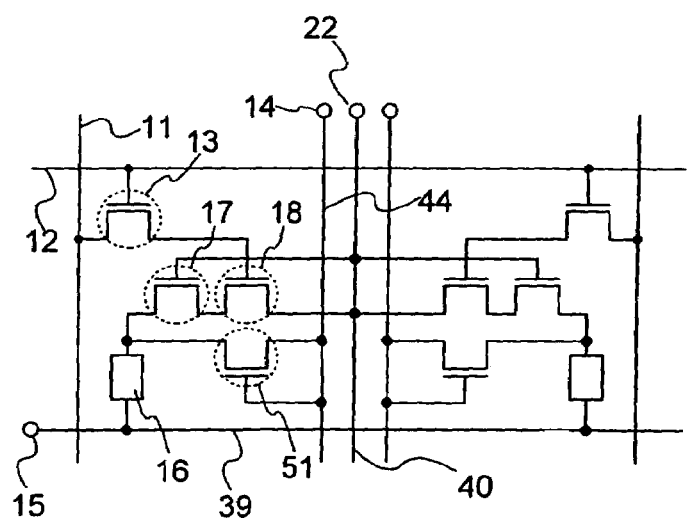

Similarly in FIG. 14A, a layout example of a pixel is shown. A structure of a pixel is the same as that of the pixel shown in FIG. 5D, and the reverse biasing TFT 51 is added to the pixel shown in FIG. 13A. Note that a circuit diagram thereof is shown in FIG. 14B. Similarly to the pixel shown in FIG. 13A, the power source line is shared between two adjacent pixels, resulting in improved aperture ratio. Since the reverse biasing TFT is added in the pixel shown in FIG. 5D, such a layout is particularly effective in view of improved aperture ratio.

Embodiment 8

A light emitting element has a structure in which a single or a plurality of layers formed of various materials (hereinafter referred to as electroluminescent layers) are disposed between a pair of electrodes. In the light emitting element, an initial defect in which an anode and a cathode are short-circuited may occur due to the following factors. As a first factor, the deposition of foreign material (dust) causes short circuit between the anode and the cathode. As a second factor, pinholes formed in the electroluminescent layer due to a slight unevenness of the anode cause short circuit between the anode and the cathode. As a third factor, pinholes formed in the electroluminescent layer that is not evenly formed cause short circuit between the anode and the cathode. The third factor is also concerned with thinness of the electroluminescent layer. In a pixel having such an initial defect, problems occur such that light emission and non-light emission are not carried out in accordance with signals, and thus almost all currents flow in the short-circuited portion and the whole element emits no light, or certain pixels emit light or no light, leading to faulty display of images. In view of the foregoing problems, as set forth above, the invention provides a display device in which a reverse bias can be applied to a light emitting element, and a driving method thereof. By applying a reverse bias, a current is locally supplied only to a short-circuited portion between an anode and a cathode, and the short-circuited portion generates heat. Thus, the short-circuited portion is oxidized or carbonized to be isolated. As a result, it is possible to provide a display device that, even when an initial defect occurs, can solve the defect and display an image with improved quality. It is noted that such isolation of the initial defect is preferably carried out before shipment.

In addition to the aforementioned initial defect, a progressive defect may occur in a light emitting element. The progressive defect means that an anode and a cathode are short-circuited as time passes. Such a short circuit between an anode and a cathode that occurs as time passes is caused by a minute projection of the anode. That is, in the laminate of a pair of electrodes with an electroluminescent layer interposed therebetween, the anode and the cathode are short-circuited as time passes. In view of the foregoing problem, the invention provides, as set forth above, a display device that applies a reverse bias regularly as well as before shipment, and a driving method thereof. When applying a reverse bias, a current flows locally in only a short-circuited portion between the anode and the cathode, leading to isolation of the short-circuited portion. As a result, it is possible to provide a display device that, even when a progressive defect occurs, can solve the defect and display an image with improved quality, and a driving method thereof.

The laminate of a pair of electrodes with an electroluminescent layer interposed therebetween has a point that does not emit light even when a forward bias voltage is applied. Such a non-light emitting defect is called a dark spot, and since it progresses with time, it is also called a progressive defect. The dark spot is caused by a defective contact between an electroluminescent layer and a cathode, and considered to progress when a minute void between the electroluminescent layer and the cathode spreads. However, such a void can be prevented from spreading when a reverse bias is applied, that is, the progression of a dark spot can be suppressed. Therefore, according to the invention that applies a reverse bias as described above, a display device that suppresses the progression of a dark spot can be achieved as well as a driving method thereof.

This application is based on Japanese Patent Application serial No. 2003-403837 filed in Japan Patent Office on Dec. 2, 2003, and No. 2003-423596 filed in Japan Patent Office on Dec. 19, 2003, the contents of which are hereby incorporated by reference.

What is claimed is:

1. A display device comprising:
a first transistor;
a second transistor;
a third transistor;
a light emitting element;
a gate line;
a source line across the gate line;
a first power source line across the gate line;
a second power source line arranged parallel to the first power source line;
a source driver;
a first gate driver; and
a second gate driver,
wherein a gate electrode of the first transistor is connected to a gate line, one of a source electrode and a drain electrode of the first transistor is connected to the source line, and the other of the source electrode and the drain electrode of the first transistor is connected to a gate electrode of the third transistor,
wherein the light emitting element, the second transistor and the third transistor are connected in series between a first power source and a second power source, wherein a gate electrode of the second transistor is connected to a second power source line so that a gate potential of the second transistor is constantly fixed to the potential of the second power source, wherein the source driver is connected to the source line, and wherein the first gate driver and the second gate driver are connected to the gate line.

2. The display device according to claim 1, wherein the source driver comprises a shift register, a latch and a switch.

3. The display device according to claim 1, wherein the source driver comprises a shift register, a latch and a switch, and wherein the switch is connected to a selection signal line.

4. The display device according to claim 1, the source driver comprising a shift register, a latch and a switch, the switch comprising:

an erasing transistor; and an analog switch disposed between the latch and the source line, wherein a gate electrode of the erasing transistor is connected to a selection signal line, one of a source electrode and a drain electrode of the erasing transistor is connected to the source line and the other of the source electrode and the drain electrode of the erasing transistor is connected to a fourth power source, and wherein a control node of the analog switch is connected to the selection signal line.

5. The display device according to claim 1, wherein the first gate driver and the second gate driver comprise at least a shift register and a switch.

6. The display device according to claim 1, wherein the first gate driver and the second gate driver comprise at least a shift register and a switch, and wherein the switch is connected to a selection signal line.

7. The display device according to claim 1, wherein the first gate driver and the second gate driver comprise at least a shift register and a tri-state buffer, and wherein an input node of the tri-state buffer is connected to the shift register, a control node of the tri-state buffer is connected to a selection signal line, and an output node of the tri-state buffer is connected to the gate line.

8. An electronic apparatus having the display device according to claim 1.

9. An electronic apparatus according to claim 8, wherein the electronic apparatus is selected from the group consisting of a TV set, a portable TV set, a digital camera, a digital video camera, a portable telephone set, a portable information terminal, a portable game machine, a monitor, a laptop personal computer, an audio reproducing device, an image reproducing device provided with a recording medium.

10. A display device comprising:

a display area comprising at least a pixel, the pixel comprising:

a first transistor;

a second transistor;

a third transistor; and a light emitting element;

a gate line;

a source line across the gate line;

a first power source line across the gate line;

a second power source line arranged parallel to the first power source line;

a source driver;

a first gate driver; and a second gate driver, wherein a gate electrode of the first transistor is connected to a gate line, one of a source electrode and a drain electrode of the first transistor is connected to the source line, and the other of the source electrode and the drain electrode of the first transistor is connected to a gate electrode of the third transistor, wherein the light emitting element, the second transistor and the third transistor are connected in series between a first power source line and a power source, wherein a gate electrode of the second transistor is connected to the second power source line so that a gate potential of the second transistor is constantly fixed to the potential of the second power source, wherein the source driver is connected to the source line, wherein the first gate driver and the second gate driver are connected to the gate line, and wherein the first gate driver and the second gate driver are disposed to face each other with the display area interposed therebetween.

11. The display device according to claim 10, wherein the source driver comprises a shift register, a latch and a switch.

12. The display device according to claim 10, wherein the source driver comprises a shift register, a latch and a switch, and wherein the switch is connected to a selection signal line.

13. The display device according to claim 10, the source driver comprising a shift register, a latch and a switch, the switch comprising:

an erasing transistor; and an analog switch disposed between the latch and the source line, wherein a gate electrode of the erasing transistor is connected to a selection signal line, one of a source electrode and a drain electrode of the erasing transistor is connected to the source line and the other of the source electrode and the drain electrode of the erasing transistor is connected to a fourth power source, and wherein a control node of the analog switch is connected to the selection signal line.

14. The display device according to claim 10, wherein the first gate driver and the second gate driver comprise at least a shift register and a switch.

15. The display device according to claim 10, wherein the first gate driver and the second gate driver comprise at least a shift register and a switch, and wherein the switch is connected to a selection signal line.

16. The display device according to claim 10, wherein the first gate driver and the second gate driver comprise at least a shift register and a tri-state buffer, and wherein an input node of the tri-state buffer is connected to the shift register, a control node of the tri-state buffer is connected to a selection signal line, and an output node of the tri-state buffer is connected to the gate line.

17. An electronic apparatus having the display device according to claim 10.

18. An electronic apparatus according to claim 17, wherein the electronic apparatus is selected from the group consisting of a TV set, a portable TV set, a digital camera, a digital video camera, a portable telephone set, a portable information terminal, a portable game machine, a monitor, a laptop personal computer, an audio reproducing device, an image reproducing device provided with a recording medium.

19. An element substrate comprising:

a first transistor;

a second transistor;

a third transistor;

a pixel electrode;

a gate line;

a source line across the gate line;

a first power source line across the gate line;
a second power source line arranged parallel to the first power source line;
a source driver;
a first gate driver; and
a second gate driver,
wherein a gate electrode of the first transistor is connected to a gate line, one of a source electrode and a drain electrode of the first transistor is connected to the source line, and the other of the source electrode and the drain electrode of the first transistor is connected to a gate electrode of the third transistor,
wherein the pixel electrode, the second transistor and the third transistor are connected in series between the first power source line and a power source,
wherein a gate electrode of the second transistor is connected to the second power source line so that a gate potential of the second transistor is constantly fixed to the potential of the second power source,
wherein the source driver is connected to the source line, and
wherein the first gate driver and the second gate driver are connected to the gate line.

20. An electronic apparatus having the element substrate according to claim 19.

21. An electronic apparatus according to claim 20, wherein the electronic apparatus is selected from the group consisting of a TV set, a portable TV set, a digital camera, a digital video camera, a portable telephone set, a portable information terminal, a portable game machine, a monitor, a laptop personal computer, an audio reproducing device, an image reproducing device provided with a recording medium.

22. An element substrate comprising:
a display area comprising at least a pixel, the pixel comprising:
a first transistor;
a second transistor;
a third transistor; and
a pixel electrode;
a gate line;
a source line across the gate line;
a first power source line across the gate line;
a second power source line arranged parallel to the first power source line;
a source driver;
a first gate driver; and
a second gate driver,
wherein a gate electrode of the first transistor is connected to a gate line, one of a source electrode and a drain electrode of the first transistor is connected to the source line, and the other of the source electrode and the drain electrode of the first transistor is connected to a gate electrode of the third transistor,
wherein the pixel electrode, the second transistor and the third transistor are connected in series between the first power source line and a power source,
wherein a gate electrode of the second transistor is connected to the second power source line so that a gate potential of the second transistor is constantly fixed to the potential of the second power source,
wherein the source driver is connected to the source line,
wherein the first gate driver and the second gate driver are connected to the gate line, and
wherein the first gate driver and the second gate driver are disposed to face each other with the display area interposed therebetween.

23. An electronic apparatus having the element substrate according to claim 22.

24. An electronic apparatus according to claim 23, wherein the electronic apparatus is selected from the group consisting of a TV set, a portable TV set, a digital camera, a digital video camera, a portable telephone set, a portable information terminal, a portable game machine, a monitor, a laptop personal computer, an audio reproducing device, an image reproducing device provided with a recording medium.

* * * * *